(12) United States Patent
Mizutani et al.

(10) Patent No.: US 10,991,543 B2
(45) Date of Patent: Apr. 27, 2021

(54) CHARGED PARTICLE BEAM DEVICE

(71) Applicant: Hitachi High-Tech Corporation, Tokyo (JP)

(72) Inventors: Shunsuke Mizutani, Tokyo (JP); Yuuji Kasai, Tokyo (JP); Minoru Yamazaki, Tokyo (JP); Makoto Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/509,694

(22) Filed: Jul. 12, 2019

(65) Prior Publication Data
US 2020/0035450 A1 Jan. 30, 2020

(30) Foreign Application Priority Data
Jul. 26, 2018 (JP) .............................. JP2018-139902

(51) Int. Cl.
| | | |
|---|---|---|
| *H01J 37/28* | (2006.01) | |
| *H01J 37/06* | (2006.01) | |
| *H01J 37/244* | (2006.01) | |
| *H01J 37/145* | (2006.01) | |

(52) U.S. Cl.
CPC .............. *H01J 37/28* (2013.01); *H01J 37/06* (2013.01); *H01J 37/145* (2013.01); *H01J 37/244* (2013.01)

(58) Field of Classification Search
CPC .......... H01J 37/28; H01J 37/06; H01J 37/244; H01J 37/145; H01J 2237/24465; H01J 2237/28; H01J 2237/024; H01J 37/20; H01J 2237/20235

USPC ................................ 250/306, 307, 310, 311
See application file for complete search history.

(56) References Cited

U.S. PATENT DOCUMENTS

| | | | | |
|---|---|---|---|---|
| 10,566,172 | B2 * | 2/2020 | Nakano | ................. H01J 37/244 |
| 2004/0183017 | A1 * | 9/2004 | Kamiya | ................. H01J 37/28 |
| | | | | 250/311 |
| 2012/0292506 | A1 * | 11/2012 | Tsuno | ...................... H01J 37/28 |
| | | | | 250/307 |

(Continued)

FOREIGN PATENT DOCUMENTS

| | | |
|---|---|---|
| JP | 58-18851 A | 2/1983 |
| JP | 9-35679 A | 2/1997 |
| JP | H0935679 A * | 2/1997 ............ H01J 37/244 |

*Primary Examiner* — Michael Maskell
(74) *Attorney, Agent, or Firm* — Crowell & Moring LLP

(57) ABSTRACT

The present disclosure is to provide a charged particle beam device capable of achieving both high resolution by setting of a short WD and improvement of detection efficiency when setting a long WD. According to an aspect for achieving the above-described object, there is suggested a charged particle beam device including: an objective lens for converging a charged particle beam emitted from a charged particle source; a sample stage having a first driving mechanism for moving a sample to be irradiated with the charged particle beam between a first position and a second position more separated from the objective lens than the first position; a detection surface for detecting charged particles emitted from the sample; and a second driving mechanism for moving the detection surface between within a movable range of the sample between the first position and the second position and out of the movable range of the sample.

18 Claims, 22 Drawing Sheets

(56) References Cited

U.S. PATENT DOCUMENTS

| | | | | |
|---|---|---|---|---|
| 2013/0313430 | A1* | 11/2013 | Ominami | H01J 37/18 |
| | | | | 250/307 |
| 2014/0175279 | A1* | 6/2014 | Agemura | H01J 37/28 |
| | | | | 250/310 |
| 2014/0346349 | A1* | 11/2014 | Nishimura | H01J 37/3177 |
| | | | | 250/307 |
| 2015/0228447 | A1* | 8/2015 | Ominami | H01J 37/00 |
| | | | | 250/307 |
| 2017/0315070 | A1* | 11/2017 | Kikuiri | H01J 37/244 |

* cited by examiner

[FIG. 1]
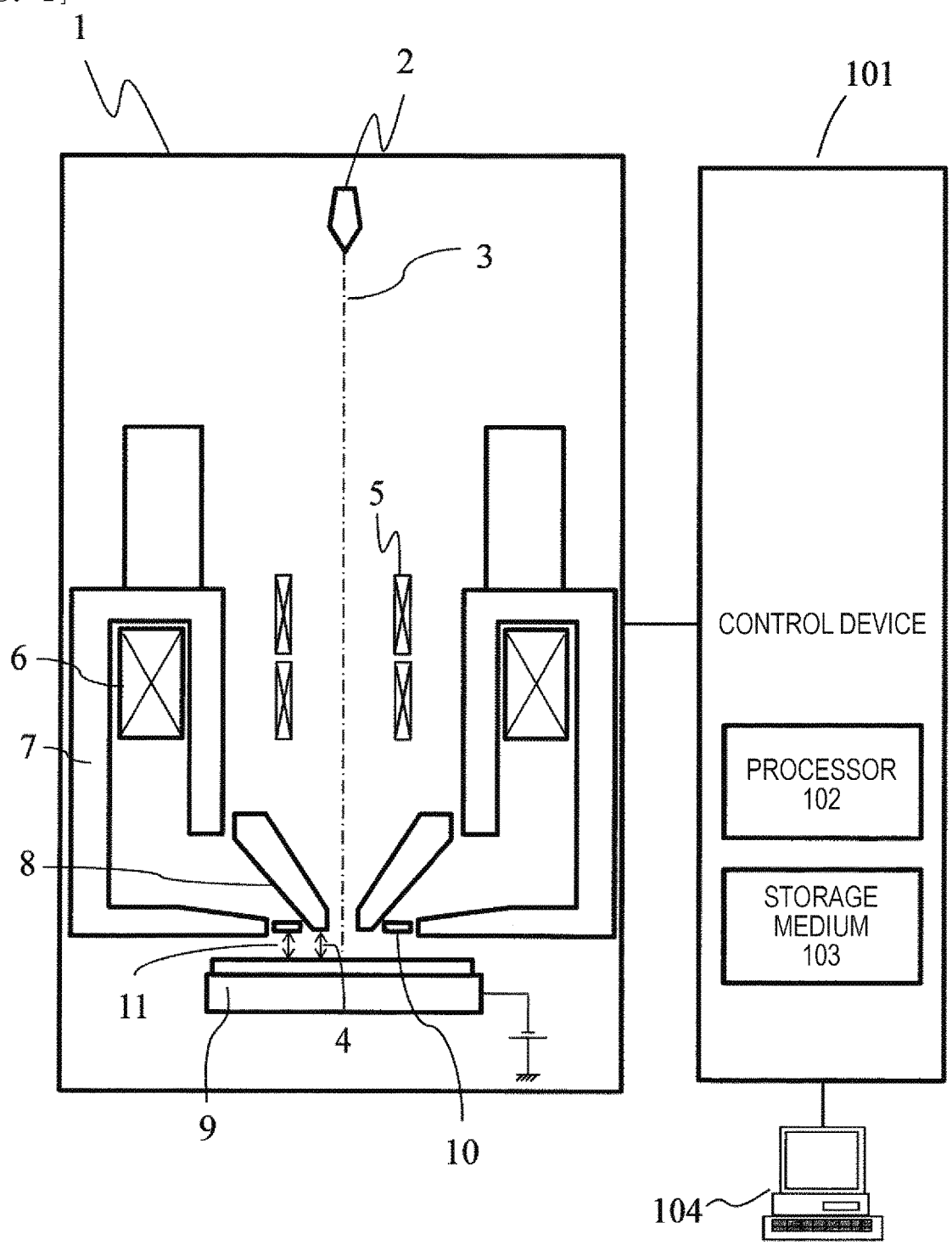

FIG. 4A
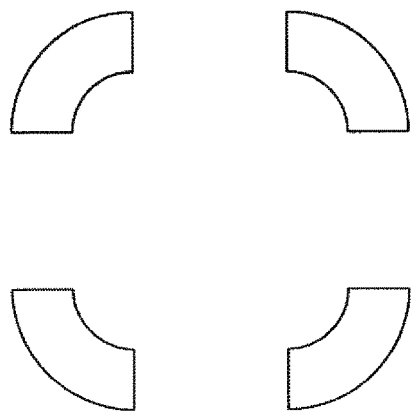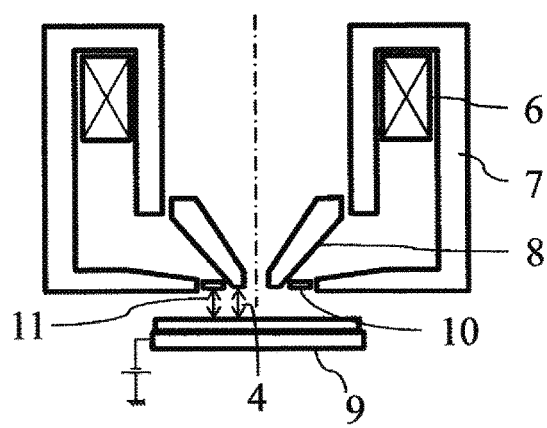
ARRANGEMENT OF DETECTION SURFACES
WHEN VIEWED FROM ABOVE
ARRANGEMENT OF DETECTION SURFACES IN CASE WHERE WD 4 IS SHORT
FIG. 4B
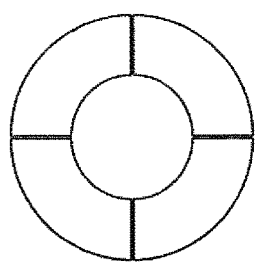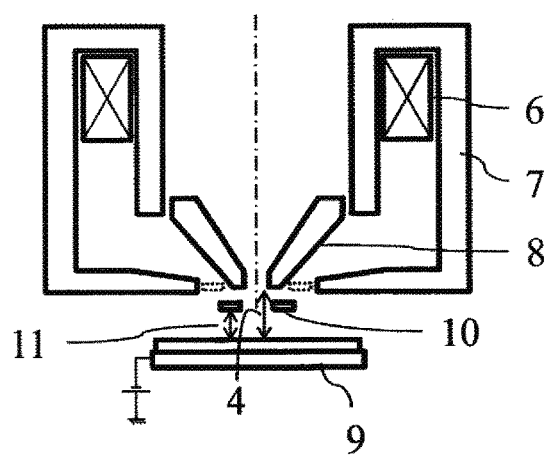
ARRANGEMENT OF DETECTION SURFACES
WHEN VIEWED FROM ABOVE
ARRANGEMENT OF DETECTION SURFACES IN CASE WHERE WD 4 IS LONG

[FIG. 5]
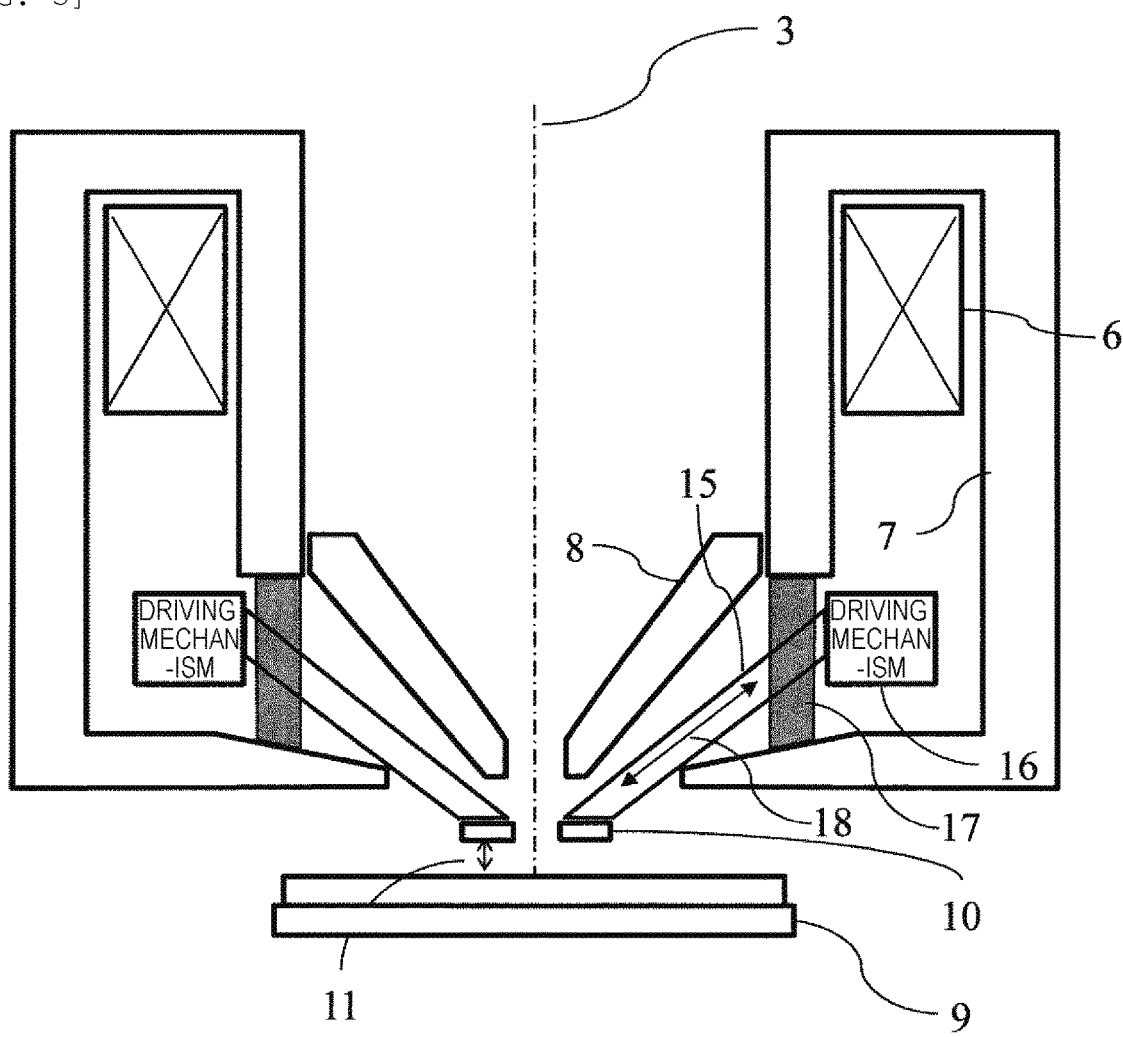

[FIG. 6]
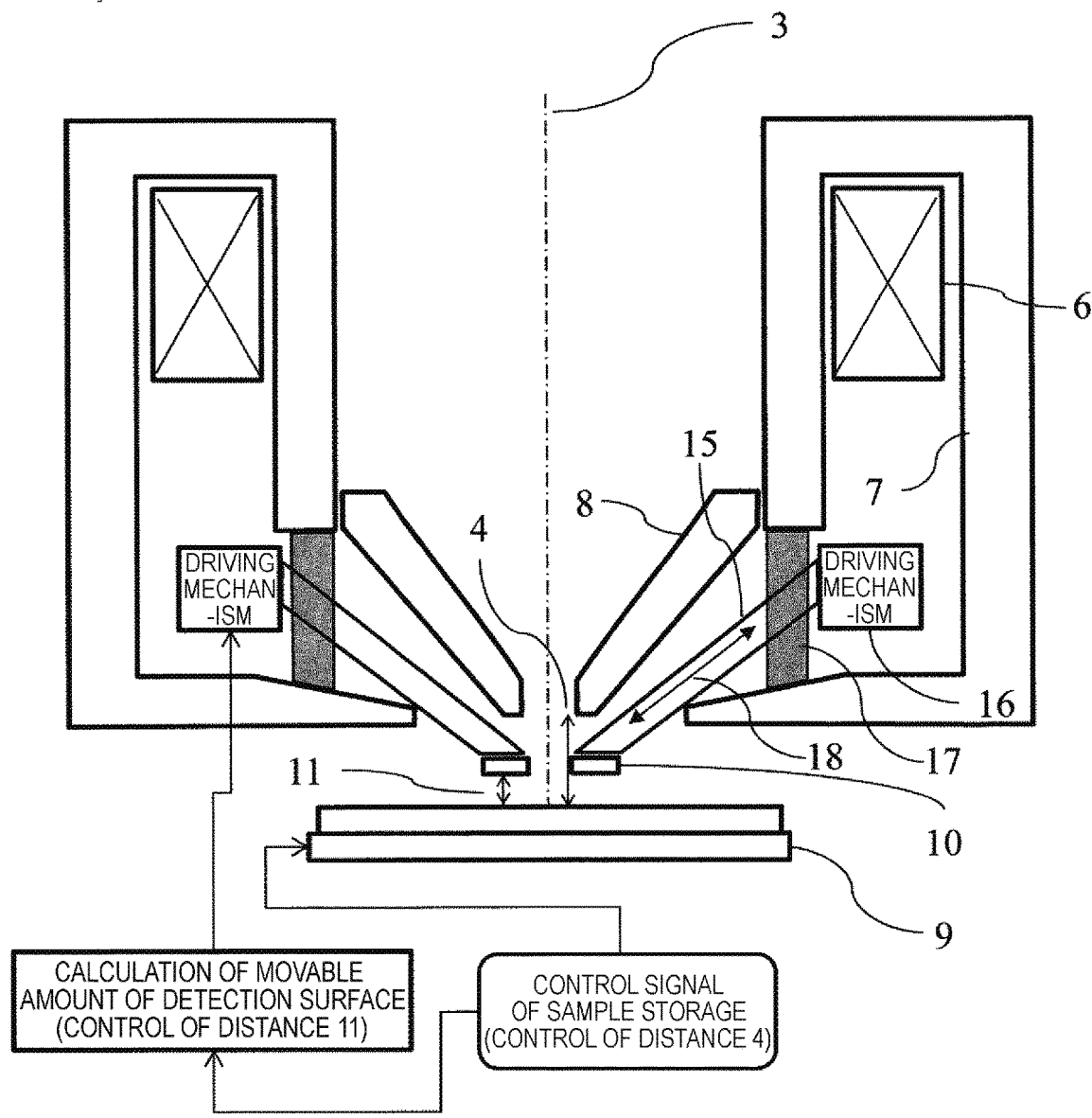

[FIG. 7]
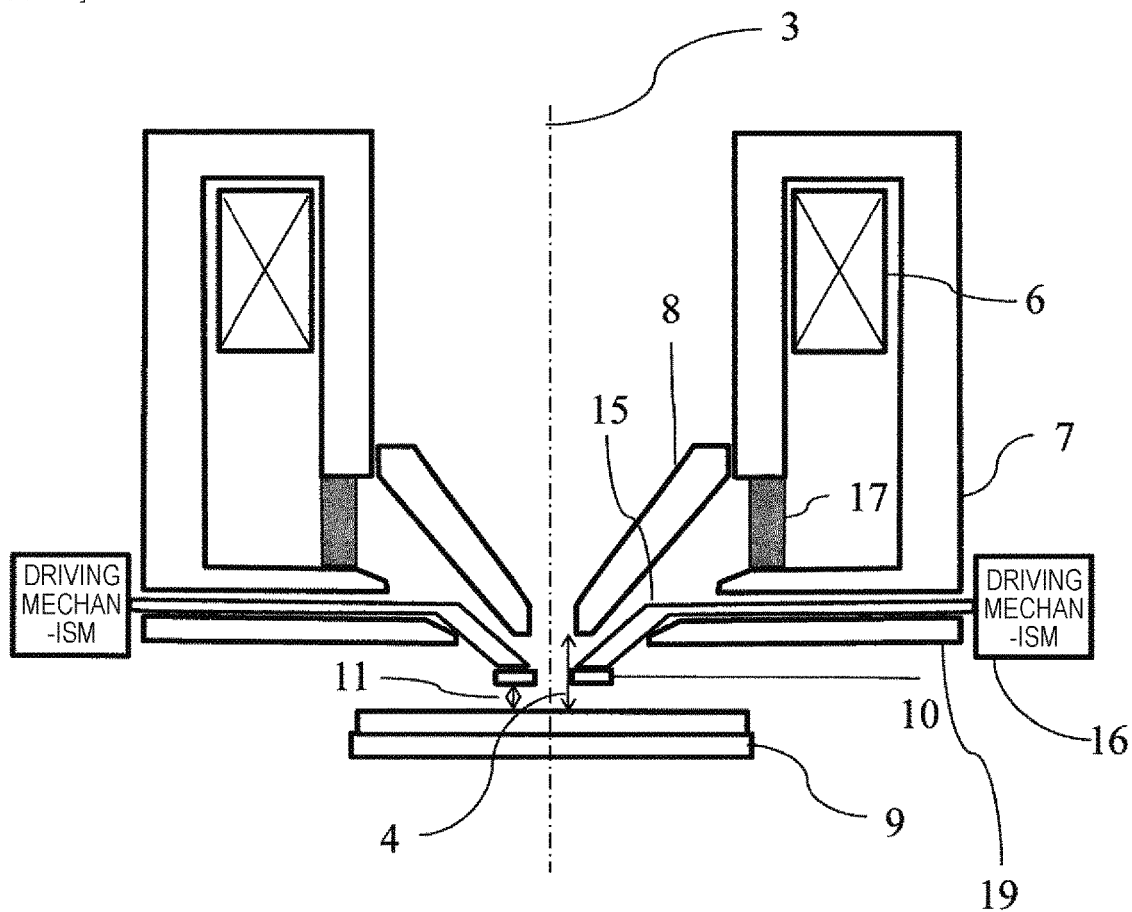

[FIG. 8]
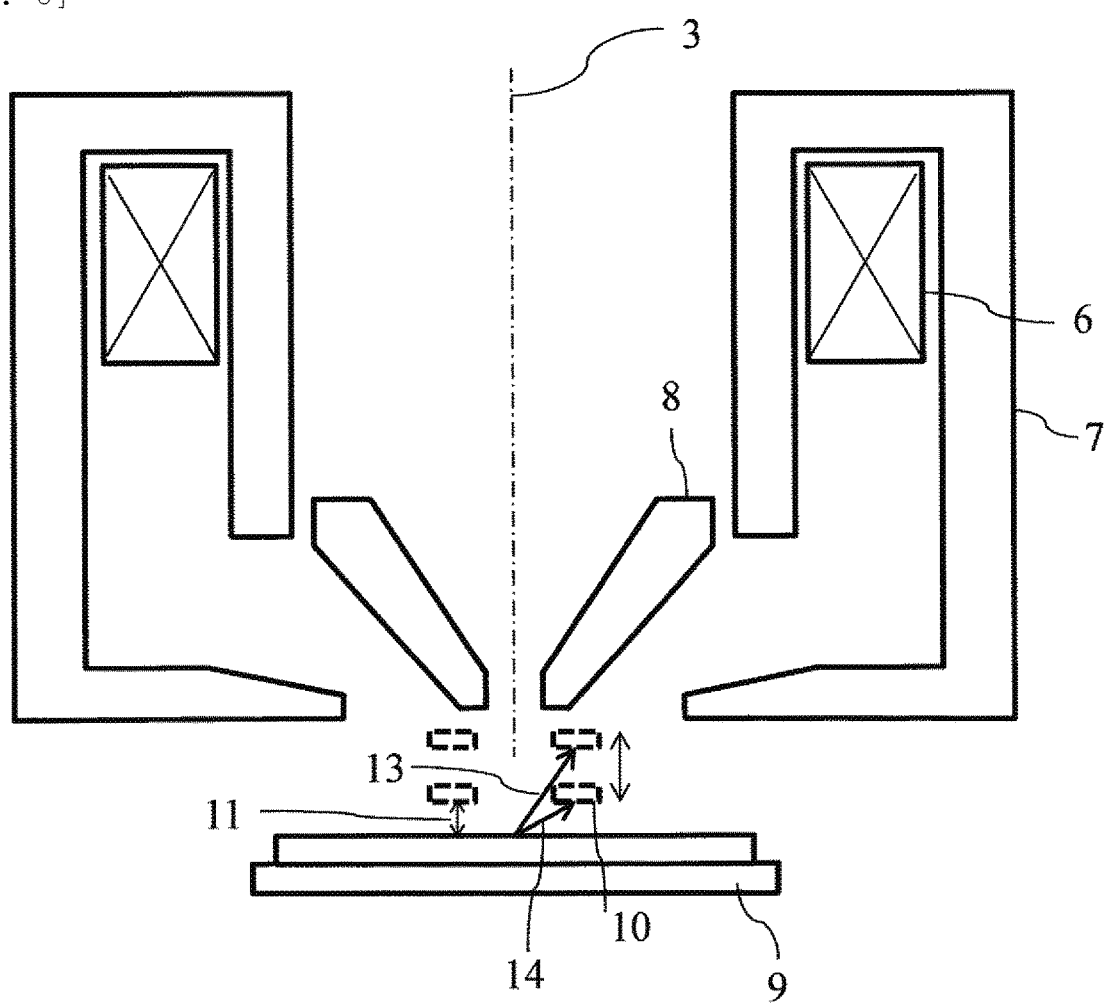

[FIG. 9]
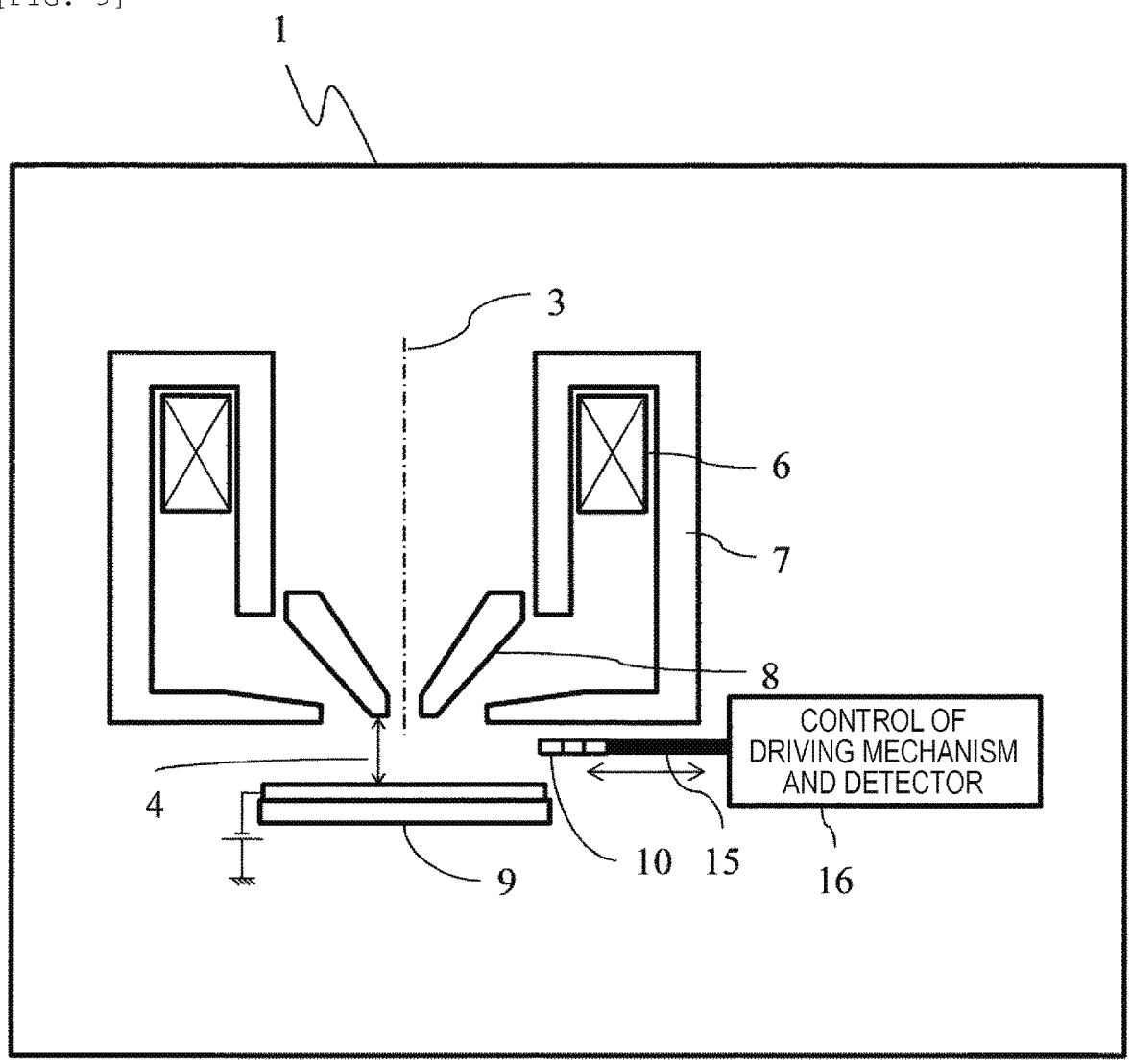

[FIG. 11]
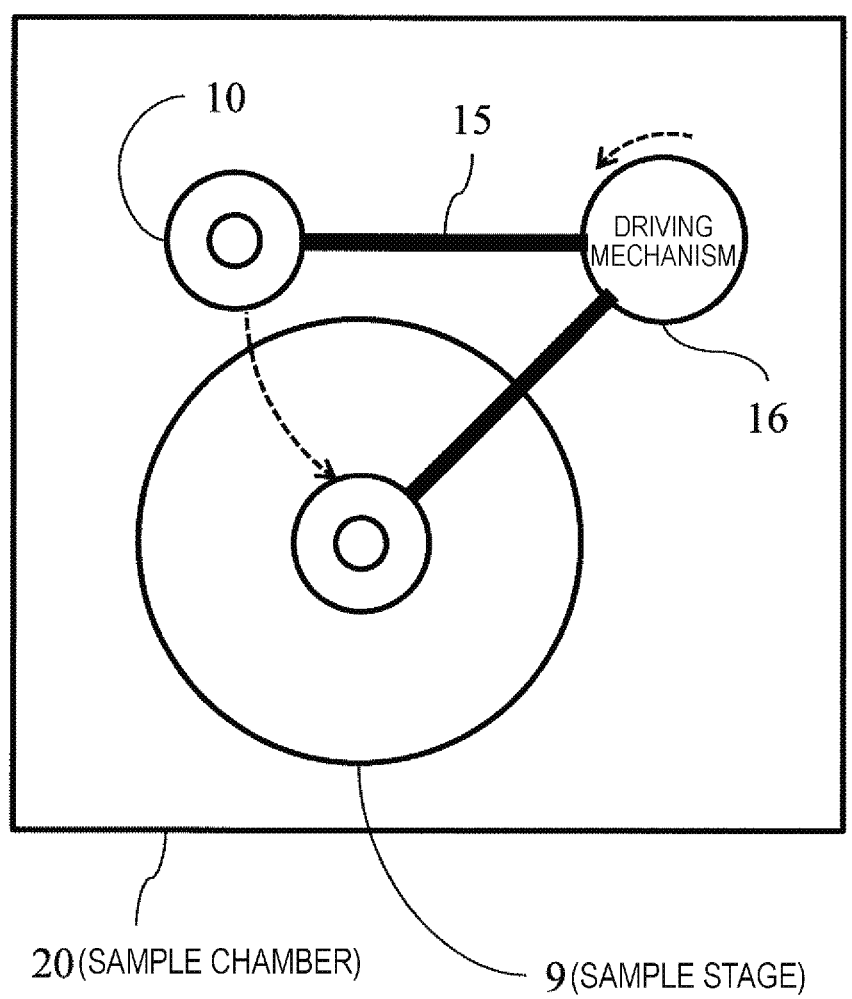

[FIG. 12]
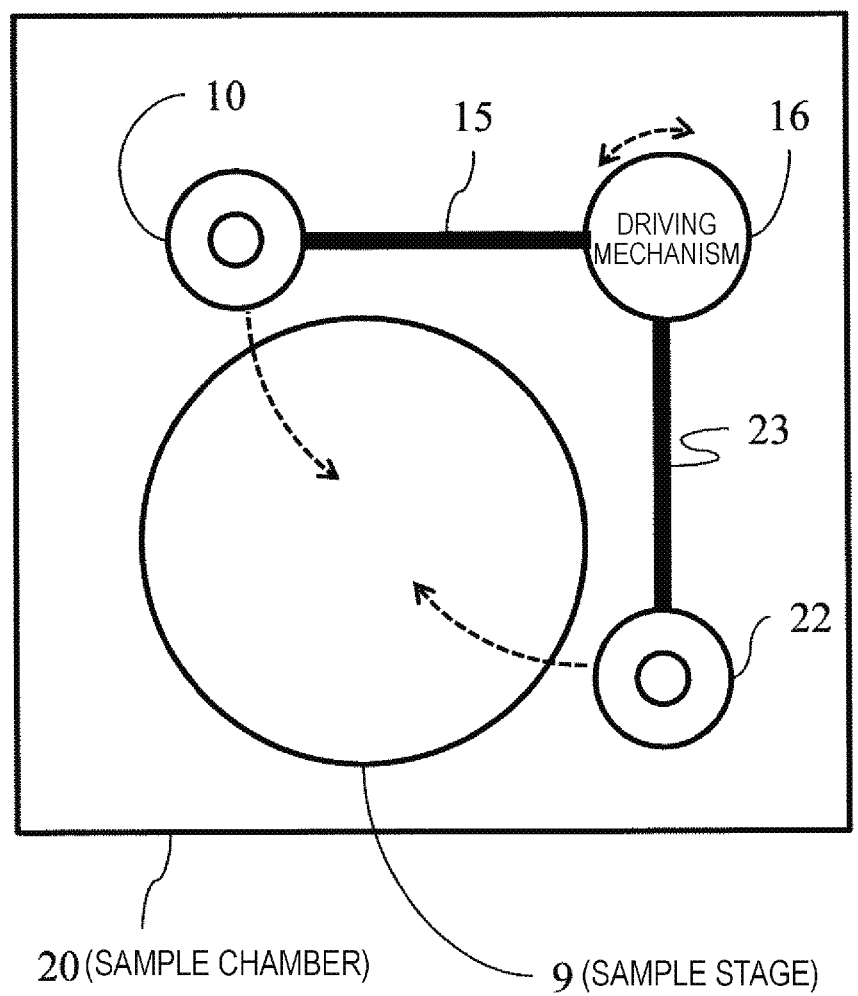

[FIG. 13]
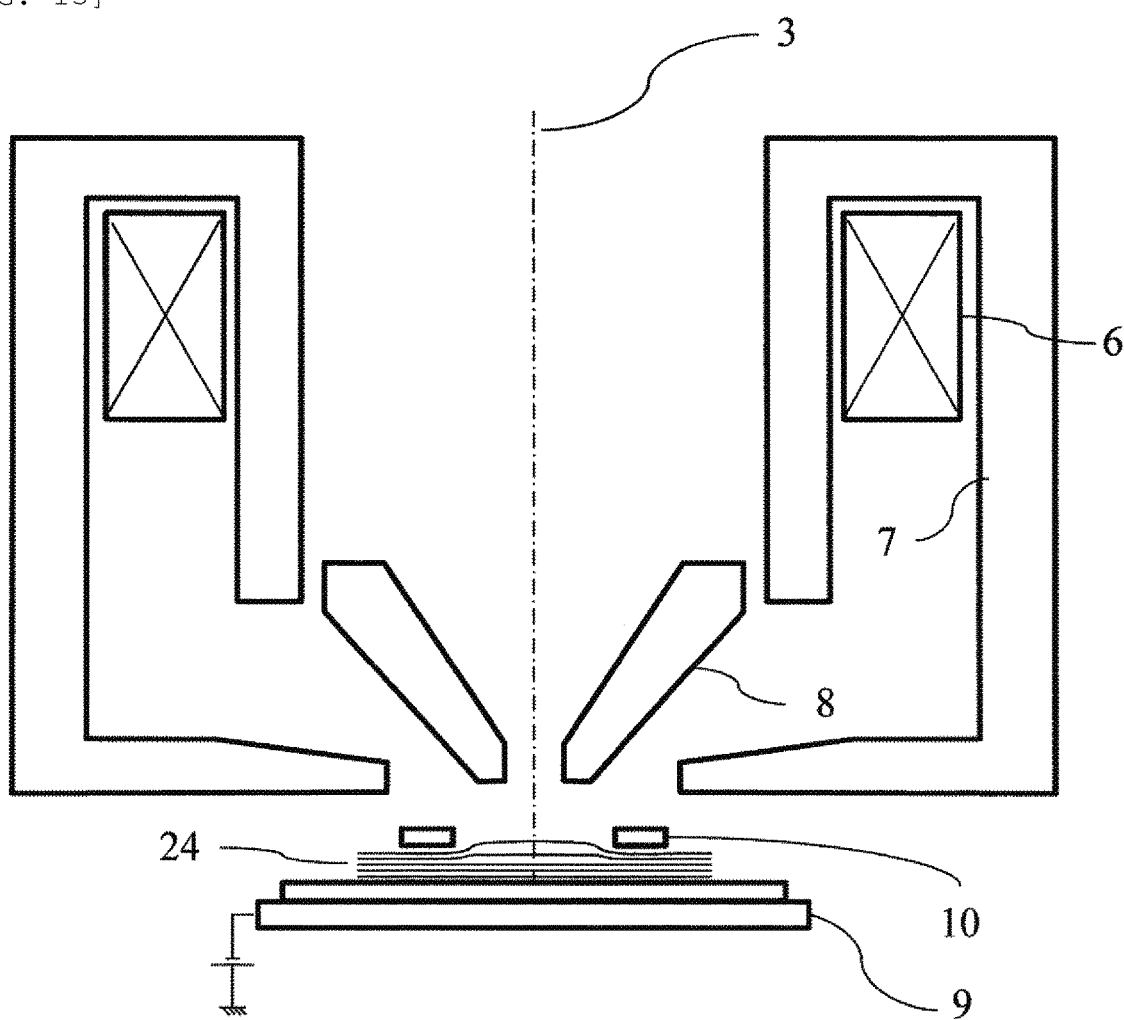

[FIG. 14]
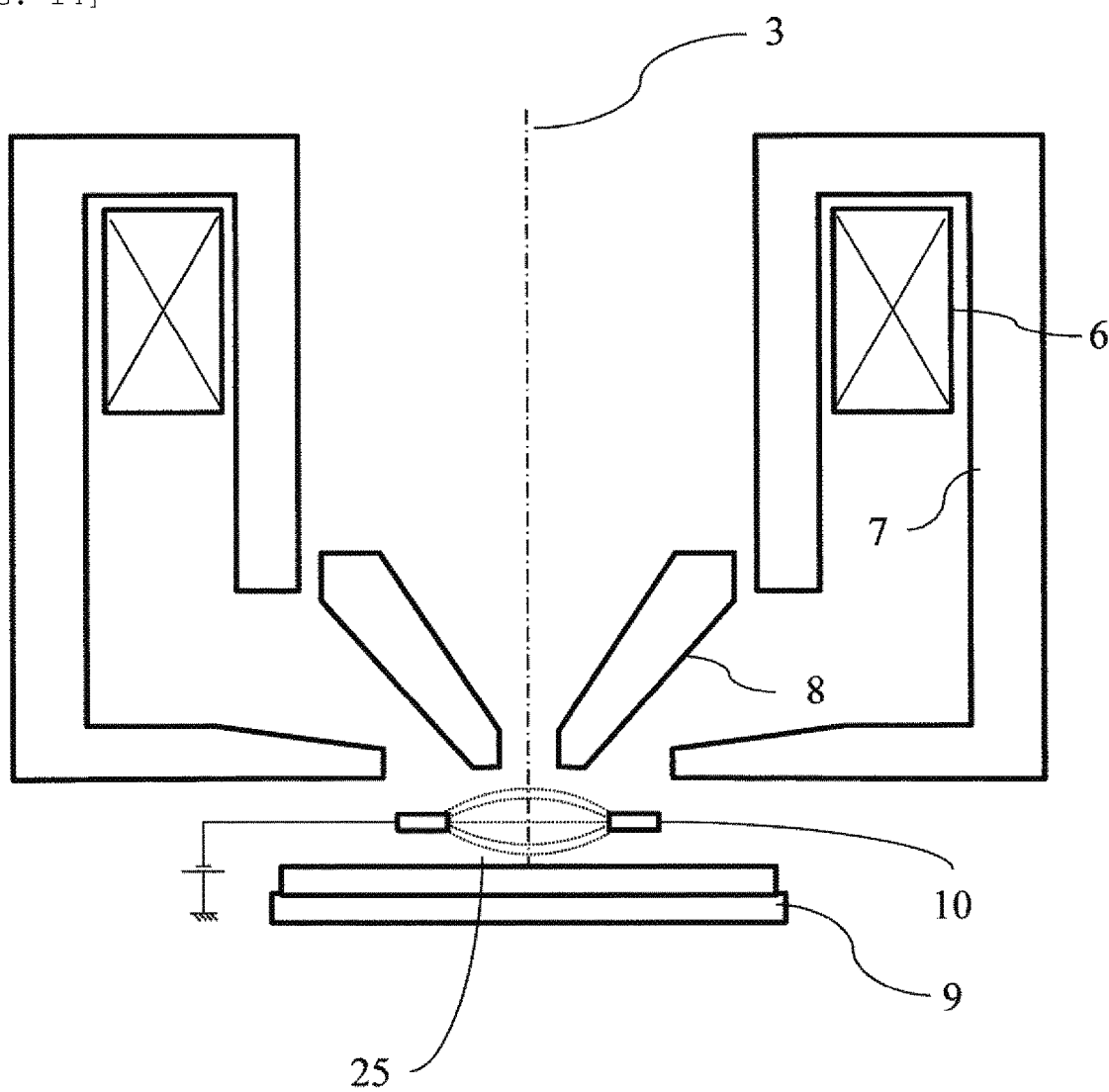

HATCHED PORTION
UPPER SURFACE OF
DETECTION SURFACE

[FIG. 18]
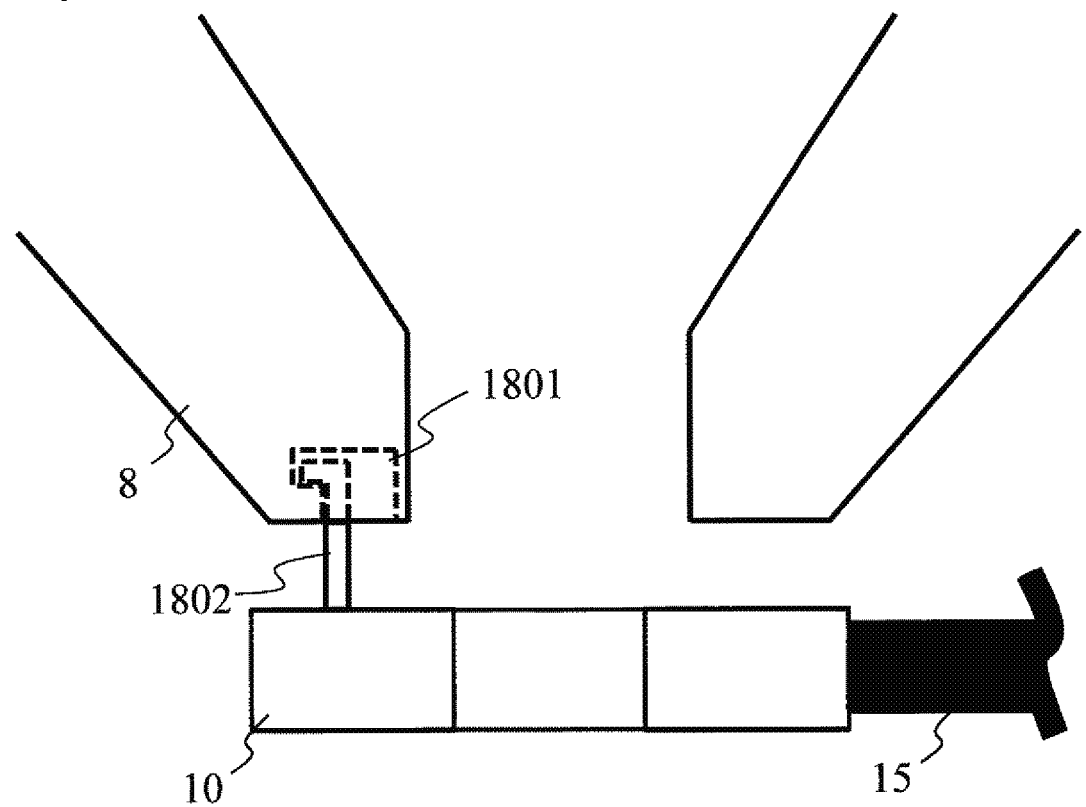
[FIG. 19]
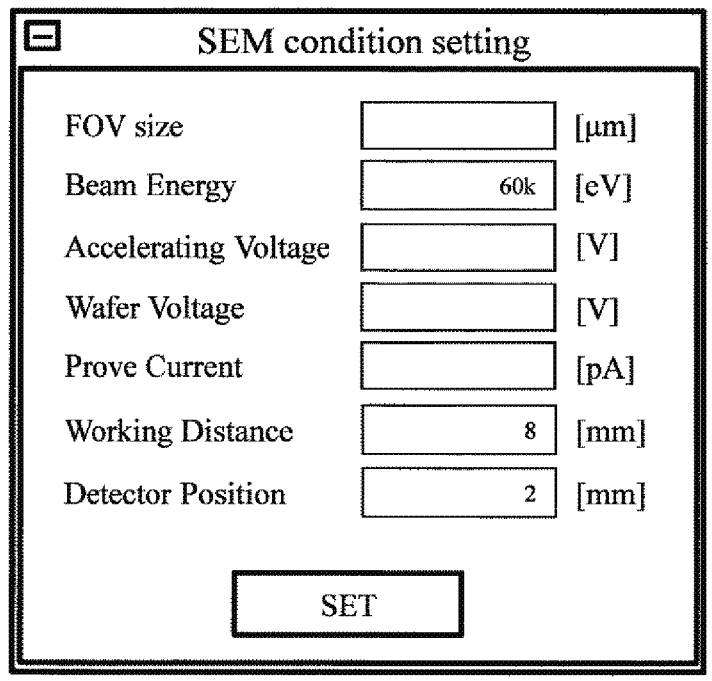

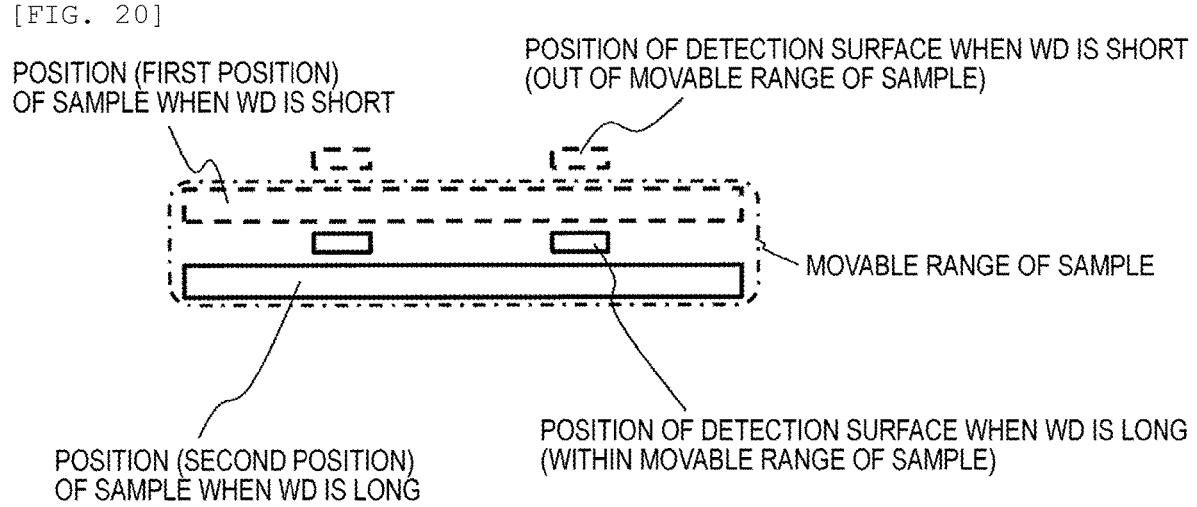
[FIG. 20]

[FIG. 21]
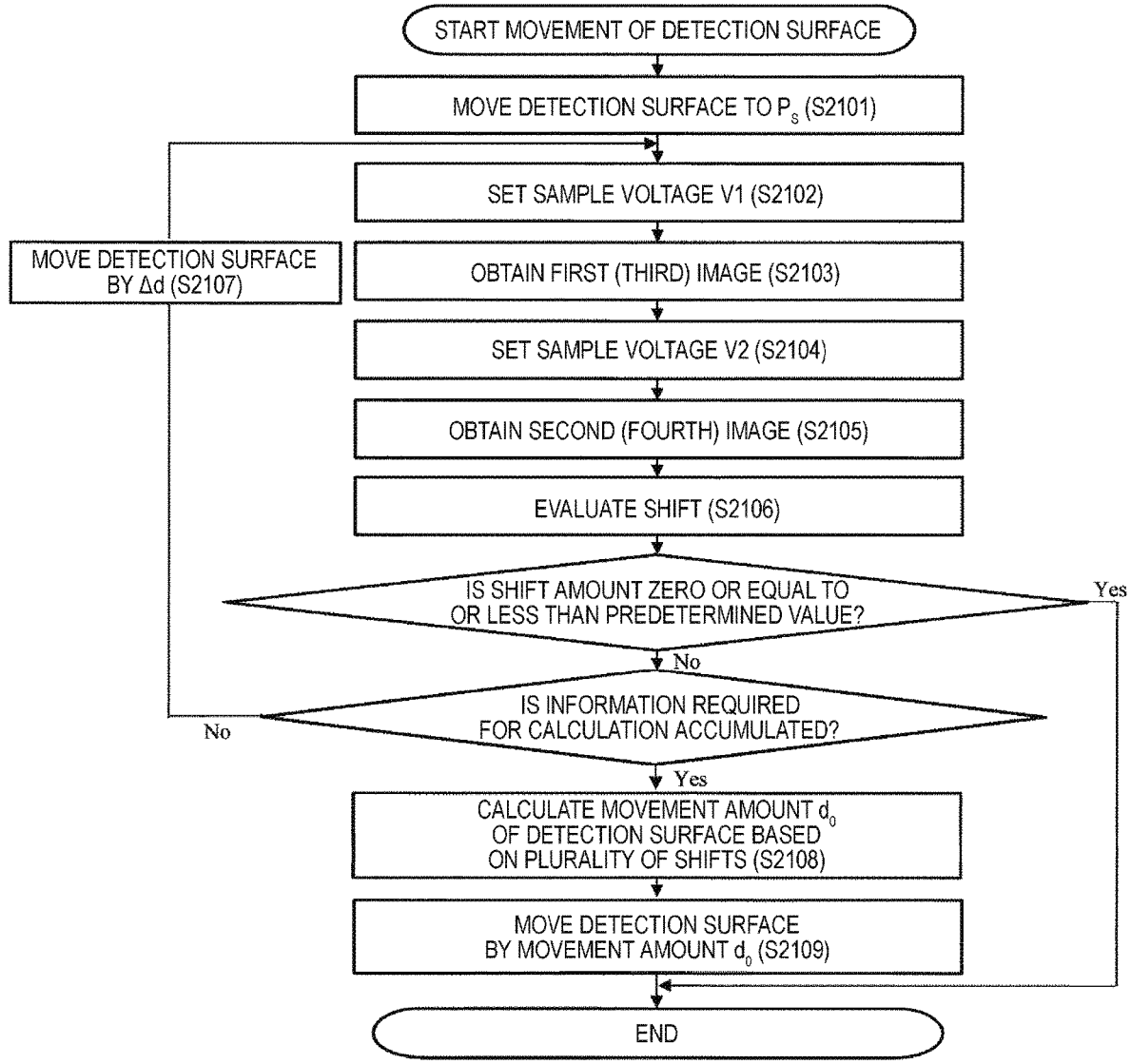

[FIG. 22]
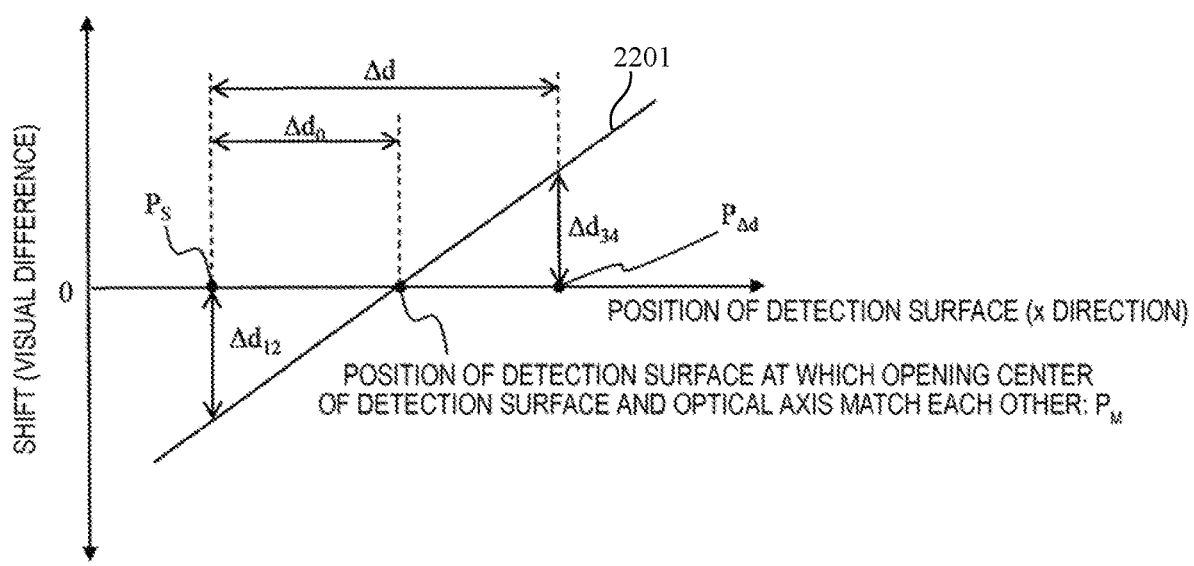

UPPER VIEW

SIDE VIEW

CHARGED PARTICLE BEAM DEVICE

TECHNICAL FIELD

The present disclosure relates to a charged particle beam device that detects charged particles emitted from a sample by irradiating the sample with a charged particle beam, and in particular, a charged particle beam device that detects the charged particles emitted to a charged particle beam optical axis and in a relative angular direction.

BACKGROUND ART

A scanning electron microscope, which is an aspect of charged particle beam device, is a device that generates an image by irradiating a sample with an electron beam and detecting signal electrons emitted from the sample. The signal electrons emitted from the sample are distinguished as signal electrons with a low energy of several eV are referred to as secondary electrons, and signal electrons with the same energy as the irradiated electron beam (several keV) are referred to as backscattered electrons (reflected electrons).

It is known that the electrons are different in generation principle and have different information on the sample. A scanning electron microscope obtains various types of information by selectively detecting the signal electrons. Patent Literature 1 discloses an electron microscope in which a detector having a driving mechanism is disposed between an objective lens magnetic path and a sample in order to detect the reflected electrons that radially spread from the sample with high efficiency. Further, Patent Literature 2 discloses a configuration in which a detection surface is provided on a lower surface of the objective lens magnetic path in order to improve resolution by shortening a focal length (WD) of the objective lens.

CITATION LIST

Patent Literature

Patent Literature 1: JP-H9-35679 A
Patent Literature 2: JP-S58-18851 A

SUMMARY OF INVENTION

Technical Problem

In a case of observing a sample configured with various materials and structures, it is necessary to improve the resolution and obtain various types of sample information. In order to achieve high resolution, it is generally effective to shorten the focal length (working distance: WD) of the objective lens. Moreover, in order to obtain various types of information, it is effective to change the energy (accelerating voltage) of the irradiated electron beam and discriminate and detect the signal electrons. For example, detection of secondary electrons by low accelerating voltage is appropriate for observing the shape of a top surface of a sample, and detection of the reflected electrons by high accelerating voltage is appropriate for observing a material buried in a lower layer of the sample.

It is difficult to maintain the WD constant in a device with a wide setting range of the accelerating voltage. At high accelerating voltage, the lens strength necessary for the convergence of electrons increases. In the magnetic field type objective lens, the magnetic field strength necessary for the convergence cannot be acquired due to the magnetic saturation of the lens magnetic path. Therefore, it is desirable to perform observation by lengthening the WD compared to that at low accelerating voltage. Meanwhile, when the WD is extended, the reflected electrons emitted from the sample being inclined receive a rotation action by a stray magnetic field of the objective lens, and the number of "return electrons" that return to the sample increases.

Patent Literature 1 illustrates a configuration of a detector for performing detection before the reflected electrons receive the rotation action and return to the sample. However, in this configuration, since it is necessary to provide a space for introducing the detector between the sample and the objective lens, it is difficult to realize high resolution based on shortening of the WD. In the configuration disclosed in Patent Literature 2, when the long WD is set, a distance between the detection surface of the electron and the irradiation point of the beam on the sample that is a generation source of the emitted electrons becomes long, and thus, detection efficiency decreases.

Hereinafter, a charged particle beam device that aims at achieving both high resolution by short WD setting and improvement of detection efficiency when setting the long WD, is suggested.

Solution to Problem

According to an aspect for achieving the above-described object, there is suggested a charged particle beam device including: an objective lens for converging a charged particle beam emitted from a charged particle source; a sample stage having a first driving mechanism for moving a sample to be irradiated with the charged particle beam between a first position and a second position more separated from the objective lens than the first position; a detection surface for detecting charged particles emitted from the sample; and a second driving mechanism for moving the detection surface between within a movable range of the sample between the first position and the second position and out of the movable range of the sample.

Advantageous Effects of Invention

According to the configuration, it becomes possible to achieve both high resolution by short WD setting and improvement of detection efficiency when setting the long WD.

CROSS REFERENCE TO RELATED APPLICATIONS

The present application claims priority from Japanese patent application JP 2018-139902 filed on Jul. 26, 2018, the content of which is hereby incorporated by reference into this application.

BRIEF DESCRIPTION OF DRAWINGS

FIG. 1 is a schematic view of a scanning electron microscope having signal electron detection surfaces between magnetic path gaps.

FIGS. 4A and 4B are views illustrating an example of an arrangement of divided detection surfaces.

FIG. 5 is a view illustrating a configuration of divided movable detection surfaces and a moving direction.

FIG. 6 is a view illustrating a configuration of control signals of positions of a sample stage and a detector.

FIG. 7 is a schematic view illustrating a configuration in which a detection surface is moved by passing through a supporting member through a magnetic path having a hole.

FIG. 8 is a schematic view illustrating detection angle control of signal electrons by detection surface height driving.

FIG. 9 is a schematic view of a case where the detection surface and the supporting member pass under an objective lens magnetic path.

FIG. 11 is a schematic view of a case where the detection surface is inserted by a rotational motion.

FIG. 12 is a schematic view in a case where a plurality of detection surfaces are provided.

FIG. 13 is a schematic view illustrating a position adjustment method by a voltage applied to a sample stage.

FIG. 14 is a schematic view illustrating a position adjustment method by a voltage applied to a detection surface.

FIG. 18 is a view illustrating a configuration of the objective lens provided with a guide hole for positioning the detection surface.

FIG. 19 is a view illustrating an example of a GUI screen for setting a device condition.

FIG. 20 is a view illustrating a relationship between a movement range of the sample and a movement range of the detection surface.

FIG. 21 is a flowchart illustrating a positioning process of the detection surface.

FIG. 22 is a view for describing a principle by which the detection surface position at which an opening center of the detection surface matches an optical axis can be specified from a shift of the image when a sample potential is changed.

DESCRIPTION OF EMBODIMENTS

Figure 2A:
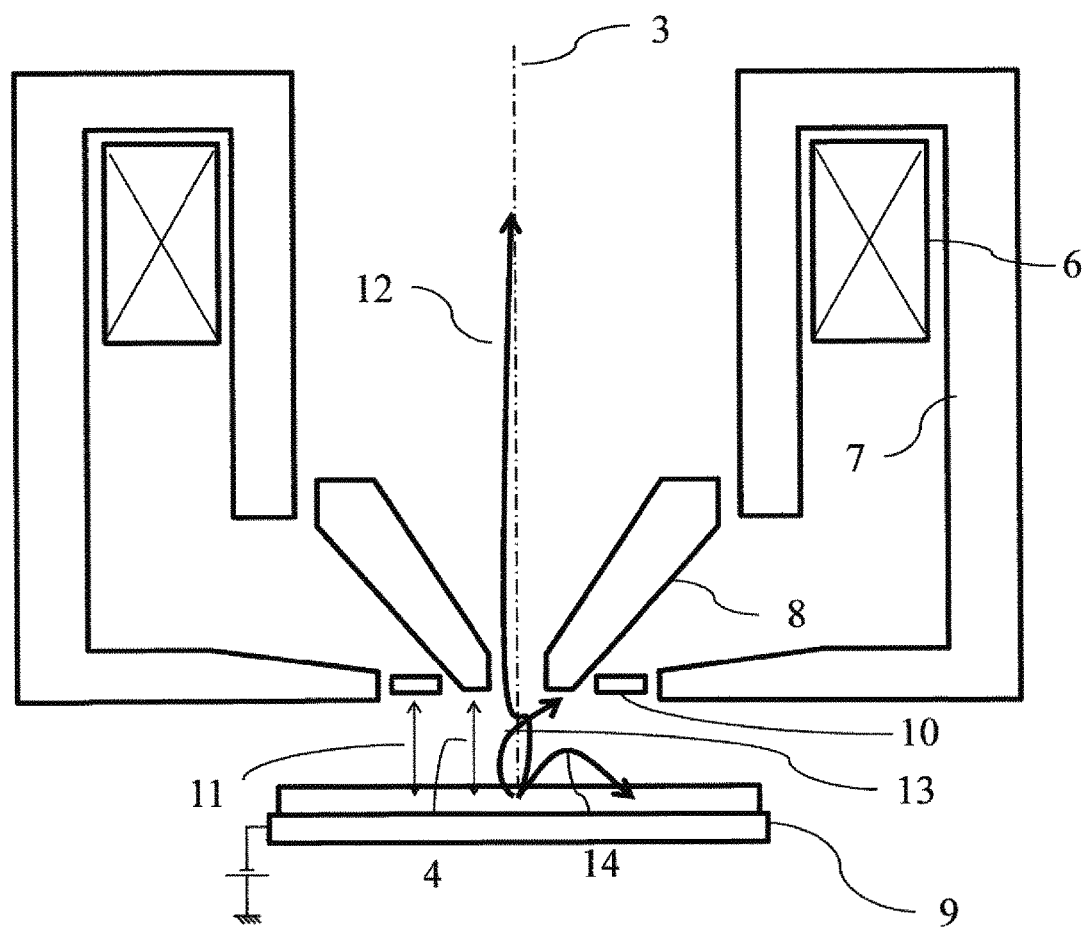
FIGS. 2A and 2B are track schematic views of reflected electrons under a long WD condition.

In an example described hereinafter, for example, a charged particle beam device including: an objective lens for converging a charged particle beam emitted from a charged particle source; a detector for detecting charged particles emitted from a sample; and a sample stage for holding the sample to be driven in a height direction, in which the objective lens has an electromagnetic coil and a magnetic path encloses the electromagnetic coil, and has a detection surface for driving while maintaining a distance between a position more separated from the sample surface than the magnetic path surface that is the closest to the sample surface and the sample surface when the height of the sample stage changes constant, will be described. According to such a configuration, it becomes possible to maintain the same detection efficiency regardless of the WD that changes in accordance with the accelerating voltage.

One of the applications of a scanning electron microscope which is one type of the charged particle beam device is evaluation of performance of a semiconductor device. A structure of the semiconductor device is becoming finer and 3D, and evaluation values required by semiconductor device manufacturers are diversified.

When the sample is irradiated with the electron beam, the interaction between the electrons and the sample causes signal electrons having various energies to be emitted in various directions. The signal electrons have different information on the sample depending on the emission energy and the emission angle, and discrimination detection of the signal electrons is essential for various measurements.

In general, signal electrons emitted at an energy equal to or less than 50 eV are distinguished as secondary electrons, and signal electrons emitted at an energy close to the energy of the electron beam and greater than the energy of the secondary electrons are distinguished as reflected electrons. The secondary electrons are sensitive to the top surface shape or phase potential of the sample, and are effective for measuring a pattern width of the device structure. In addition, the reflected electrons include information on the composition or three-dimensional shape of a sample, and information, such as a difference in the composition of a bottom portion or a lower layer of a 3D structure can be acquired.

In addition, in the following description, an optical axis direction of the electron beam is defined as 90 degrees with respect to the emission angle of electrons emitted from the sample. In accordance with the emission angle, reflected electrons having an angle which is close to 90 degrees are defined as high angle reflected electrons, reflected electrons having an angle which is close to 45 degrees are defined as middle angle reflected electrons, and reflected electrons having an angle which is close to 0 degree are defined as low angle reflected electrons. It is known that the emission distribution of the reflected electrons is a cosine distribution that is the largest in a middle angle direction and is small in high angle and low angle directions.

Hereinafter, the scanning electron microscope is described which realizes achievement of both high resolution and high efficiency of signal electron detection. Specifically, a scanning electron microscope that achieves both high resolution and high efficiency detection of signal electrons by moving the detector while maintaining the distance with the sample surface constant in accordance with various accelerating voltages and WDs and by accommodating the detector between the magnetic paths when the WD is short, is described.

In the example described below, for example, a charged particle beam device including: a charged particle beam source for generating a primary charged particle beam (electron beam); a magnetic field type objective lens for converging the charged particle beam on the sample; a deflector for deflecting the primary charged particle beam on the sample; and a sample stage that can move the sample to three axes of x, y, and z, in which the detection surface is disposed between gaps of the objective lens magnetic path in a case where the distance between the objective lens and the sample stage is short, and the detection surface is activated while maintaining the distance between the sample surface and the detection surface constant in a case where the distance between the objective lens and the sample stage is far, is described.

An outline of the scanning electron microscope will be described below with reference to the drawings.

Example 1

FIG. 1 is a view illustrating the outline of the scanning electron microscope. An electron source 2 is disposed on the inside of an electron microscope barrel 1 which is in a vacuum environment, and the primary electron beam (electron beam) emitted from the electron source 2 flies along a primary electron beam optical axis 3. The primary electron beam is converged to the sample held on a sample stage 9 by an objective lens magnetic field configured with an objective lens coil 6 and an outer magnetic path 7 that encloses the objective lens coil 6 and an inner magnetic path 8. Further, an electron microscope image is acquired by performing two-dimensional scanning on the sample by a deflector 5. A semi-in-lens type, which is a general objective lens configuration that achieves high resolution, has a gap portion between the outer magnetic path 7 and the inner magnetic path 8. A focal length of the objective lens is defined as a distance between the lower surface of the inner magnetic path 8 and the sample surface, and the distance is referred to as a working distance (WD) 4.

The sample stage 9 that holds the sample is driven within a plane of x and y and in the height direction of z by a driving mechanism, and the WD 4 changes according to the height of the sample stage 9. In a case where a sample having a large area in an x-y direction such as semiconductor wafer is regarded as a target, for example, a driving mechanism using a linear motor as a driving source may be adopted for driving in the x-y direction, and for example, a driving mechanism using a piezo actuator as a driving source may be adopted for moving in the z direction that does not require a large movement.

A negative voltage is applied to the sample stage 9, and the sample is irradiated with the primary electron beam with an energy lower than the energy acquired by the accelerating voltage after the emission. The signal electrons emitted from the sample have a track that corresponds to the emission energy and the emission angle while receiving influence of the objective lens magnetic field and the negative voltage applied to the sample stage 9. A detection surface 10 is disposed at a position separated from the sample by a distance 11, and the distance 11 is the same as or longer than the WD 4. In addition, the detection surface 10 is disposed in the gap portion of the objective lens magnetic path or on a surface on the sample side of the outer magnetic path 7 or the inner magnetic path 8. The signal electron is detected by the detection surface 10.

A control device 101 controls optical elements, such as an acceleration electrode, a deflector for scanning, and each lens, a driving mechanism incorporated in the sample stage 9, a driving mechanism for adjusting the position of the detector, and the like according to an operation program (recipe) stored in a storage medium 103 in advance. The operation program can also be set, for example, according to the operation conditions input from an input device 104. The control device 101 executes calculation or control based on an instruction set described in the recipe. A processor 102 is mounted to execute the instruction set described in a software program stored in the storage medium 103.

It is desirable to change the position of the detection surface 10 in accordance with the WD 4. FIG. 2(a) illustrates a track schematic view of the reflected electrons in a case where the WD 4 is long. The high angle reflected electrons fly along a track 12 and penetrate the inside of the electron microscope barrel. The high angle reflected electrons having an angle close to the middle angle fly along a track 13 and collide with a tip end portion of the inner magnetic path 8. The medium to low angle reflected electrons fly along a track 14 and return to the sample. In addition, in the example, the reflected electrons directed in a direction close to the optical axis of the beam relative to other reflected electrons are referred to as high angle reflected electrons, and the reflected electrons directed in a direction close to a direction parallel to the sample surface are referred to as low angle reflected electrons. In addition, the electrons that return to the sample along a track like the track 14 are referred to as return electrons.

Figure 2B:
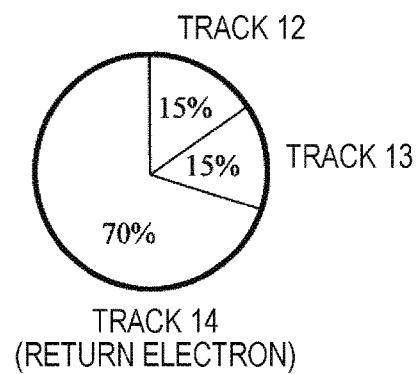

FIG. 2(b) is a graph illustrating a ratio of the tracks 12 to 14 among the generated reflected electrons. Under certain optical conditions, approximately 70% of the reflected electrons become return electrons and cannot be detected. Further, since the return electrons have a track which returns to the sample in a space between the outer magnetic path 7 or the inner magnetic path 8 and the sample, the distance 11 must be shortened for high efficiency detection of the reflected electrons.

Figure 3A:
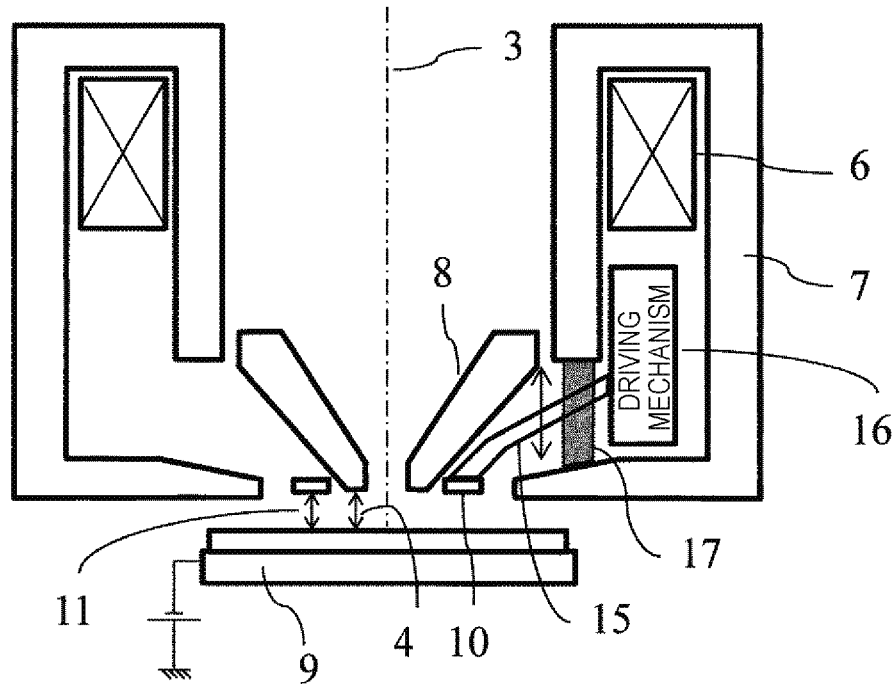
FIGS. 3A and 3B are schematic views illustrating a relationship between a WD and a detection surface position and a driving mechanism.
Figure 3B:
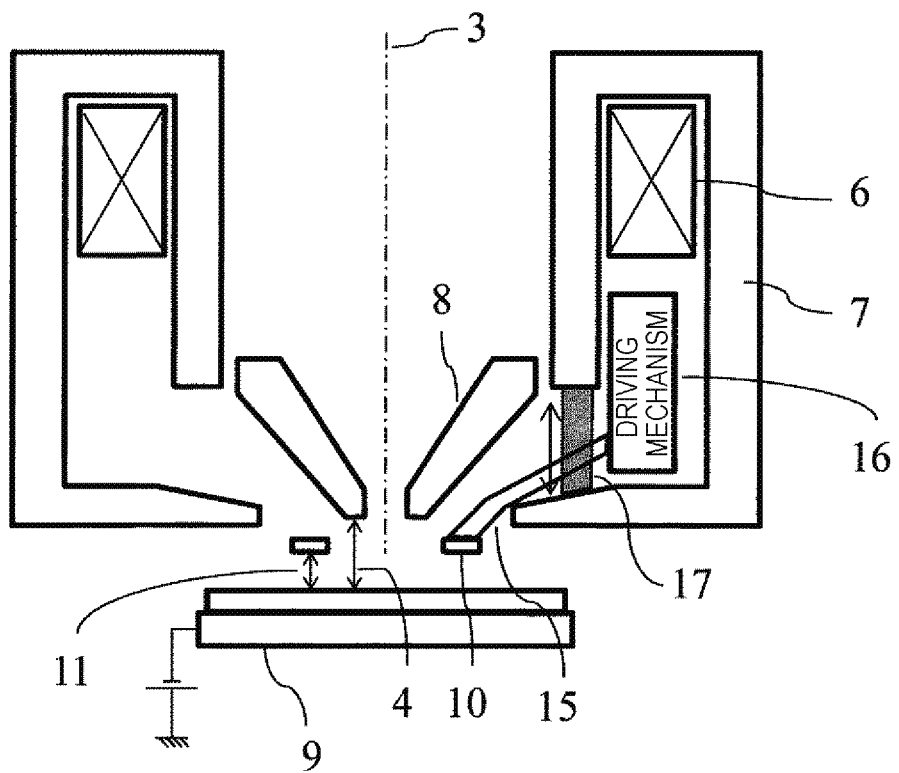

FIG. 3 illustrates a schematic view of a moving mechanism for moving the detection surface 10 with a change of the WD 4. FIG. 3(a) illustrates an arrangement in a case where the WD 4 is short, and FIG. 3(b) illustrates an arrangement in a case where the WD 4 is long. The detection surface 10 is held by a supporting member 15. A vacuum sealing member 17 is disposed in the outer magnetic path 7 in order to make the space enclosed by the outer magnetic path 7 with the objective lens coil 6 at an atmospheric pressure. The supporting member 15 is disposed to penetrate the vacuum sealing component 17 and has a driving mechanism at an atmospheric pressure space. The detection surface 10 is moved in the height direction by a driving mechanism 16, and the detection surface 10 moves with the change of the WD 4. At this time, the detection surface 10 is driven to maintain the detection surface distance 11. According to this configuration, the detection can be performed at the same estimated angle with respect to the emission angle of signal electrons without depending on the WD 4.

As the detector including the detection surface 10, a semiconductor detector that converts the signal electrons into the electric signal, or an ET type detector that converts the signal electrons into light, detects the light, and converts the light into an electric signal, is used. A semiconductor detector that can be configured with one component is an effective detector due to a narrow space of the detector.

Meanwhile, since a throughput is required in a case of being used as an evaluation device of a semiconductor device, it is also effective to use the ET type detector from the viewpoint of high light emission intensity and high speed response. In a case of the ET type detector, a scintillator for converting the electrons into light may be a single crystal, such as YAP or YAG, as long as a material that emits light upon incidence of the charged particles is employed, or may be a powder, such as P47, or a multilayer thin film structure of a GaN system.

For example, a photomultiplier tube (PMT), a photodiode, Si-PM or the like can be used to detect light. However, the photodiode or the Si-PM which is unlikely to receive influence of an external magnetic field is appropriate since the photodiode or the Si-PM is disposed in the objective lens magnetic field. A light guide or an optical fiber can also be used to guide light to a light detection element, but a configuration in which the light detection element is installed on the scintillator and a light-guiding member, such as a light guide, is not used, may be employed. In a case of using the light-guiding member, the size of the detector is reduced so that the light-guiding member works as the supporting member 15.

The driving mechanism may be a driving mechanism in which the supporting member 15 itself is a driving mechanism, such as a ball screw, or a driving mechanism in which the supporting member 15 is sent out, such as a motor. A nonmagnetic ultrasonic motor intended to be used particularly in high magnetic fields is effective.

According to the detector provided with the driving mechanism as illustrated in FIG. 3, since it is possible to accommodate the detection surface (detector) in a lens gap (a gap provided between the inner magnetic path and the outer magnetic path, that is, a part at which the stray magnetic field is generated) of the objective lens as necessary, it becomes possible to set appropriate device conditions in accordance with the accelerating voltage to beset. Specifically, it becomes possible to realize both the high resolution of the device when setting the low accelerating voltage and the high efficiency detection of electrons when setting the high accelerating voltage.

A z driving mechanism of the stage is controlled such that the detection surface is accommodated in the lens gap with priority given to resolution and the sample approaches the objective lens when setting the low accelerating voltage, the z driving mechanism of the stage is controlled such that a beam converged by the objective lens focuses on the sample surface when setting the high accelerating voltage, and such that the sample is more separated from the objective lens compared to that when setting the low accelerating voltage, and the driving mechanism for supporting the detection surface is controlled such that the detection surface is positioned below the lower surface of the magnetic path of the objective lens.

In the example, in order to make the stray magnetic field downward (sample side) leak, the semi-in lens in which the lens gap is opened downward is adopted. The semi-in-lens is a lens including: an inner magnetic pole (first magnetic pole) of which an end portion is close to the beam optical axis; and an outer magnetic pole (second magnetic pole) of which the end portion is disposed to be more separated from the beam optical axis than the end portion of the inner magnetic pole, in which the lens gap formed between the inner magnetic pole and the outer magnetic pole opposes the sample surface. Accordingly, it is possible to ensure a movement track of the detection surface that moves in an upward-downward direction and an accommodation portion that accommodates the detection surface when setting the short WD. In addition, since the semi-in lens is a type of lens that makes the magnetic field leak downward, a lens main surface can be brought close to the sample, and the sample is not surrounded by the magnetic path similar to an in-lens, and thus, it is also possible to respond to a large sample.

In addition, FIG. 3 illustrates a configuration example in which the detection surface 10 can be completely accommodated (a state where the detection surface is positioned above (electron source side) the lowermost portion of the objective lens magnetic path) in the lens gap of the objective lens, but the present disclosure is not limited thereto, and for example, even when a part of the detection surface is accommodated in the lens gap and the other part of the detection surface is positioned below the lowermost portion of the objective lens magnetic path, a dimension of a non-accommodating part in the z direction may be shorter than the short WD (when setting the low acceleration voltage) to be set. In other words, even in a partially accommodated state, it becomes possible to realize both the short WD when setting low acceleration and the improvement of the detection efficiency when setting high acceleration.

FIG. 20 is a view illustrating a relationship between a movement range of the sample mounted on the sample stage 9 in the z direction and a movement range of the detection surface 11 in the z direction. As illustrated in FIG. 20, the movable range of the sample stage and the driving mechanism (second driving mechanism) of the detection surface is set such that the detection surface can reach within the movable range of the sample in the z direction (the movable range of the sample by the first driving mechanism for moving the sample stage in the z direction). In other words, when the WD is short, the sample moves to be close to the objective lens, and each driving mechanism is controlled to retract the detection surface from the movable range of the sample. Meanwhile, when the energy reached by the beam to the sample is set relatively high, the sample stage is moved such that the WD is long, and each driving mechanism is controlled to lower the detection surface.

By performing the above-described control, it becomes possible to realize both the short WD when setting the low acceleration and the improvement of the detection efficiency when setting high acceleration as described above.

FIG. 19 is a view illustrating an example of a graphical user interface (GUI) screen displayed on a display screen or the like of the input device 104. The control device 101 controls each optical element, driving mechanism or the like based on the device conditions, such as visual field size, beam energy, accelerating voltage, sample voltage, beam current, WD, position of the detector (in this example, the distance from the sample) and the like set from the GUI screen as illustrated in FIG. 19. In the example of FIG. 19, the beam energy is set to 60 keV. Since the beam energy (the energy reached by the beam to the sample) is determined by a difference between the voltage applied to the acceleration electrode and a sample voltage, the accelerating voltage and the sample voltage may be set by reading out a data set of the accelerating voltage and the sample voltage which are stored in the storage medium based on the setting of the beam energy, and the beam energy may be indirectly set based on the setting of the accelerating voltage and the sample voltage.

In addition, the WD may be automatically set based on the setting of the beam energy. In a case where a predetermined threshold value for the beam energy and a beam energy that exceeds the threshold value is set, a program that automatically sets the WD longer than that when setting the low accelerating voltage may be stored in advance in the storage medium 103. Furthermore, a table indicating the relationship between the beam energy and the WD, or an arithmetic expression is stored in advance, and it is also possible to prepare a program for automatically performing the adjustment (control of the z driving mechanism of the sample stage) of the WD in accordance with the set beam energy. In this case, a table or an arithmetic expression is prepared such that the WD increases as the accelerating voltage increases.

Furthermore, the position of the detector may be automatically adjusted by predetermining the position of the detector. In this case, the control may be performed to maintain the distance between the sample and the detector by automatically adjusting the position of the detector following the change in WD.

In addition, in accordance with the setting of the low accelerating voltage, the short WD setting and the accommodation of the detector in the lens gap are automatically performed, and in accordance with the high accelerating voltage setting, the long WD setting and the control for making the detector approach the sample are automatically performed.

According to the configuration illustrated in FIG. 3, it becomes possible to set the device conditions appropriate for both the setting of the high accelerating voltage and the setting of the low accelerating voltage.

Next, another configuration example of the detector that can be accommodated in the lens gap will be described. FIG. 4 illustrates an arrangement view in a case where the detection surface is divided. FIG. 4(a) is an arrangement view in a case where the WD 4 is short. FIG. 4(b) is an arrangement view in a case where the WD 4 is long, and the shape is determined so as to form an annular shape when the detection surface 10 moves while maintaining the detection surface distance 11.

FIG. 5 illustrates a structure of a movable system in which the detection surface is divided and the inner diameters thereof are brought close to each other as illustrated in FIG. 4. In a case where the WD 4 is long, the reflected electrons become return electrons in a wide angle range, and accordingly, in order to increase the number of detected electrons, it is effective to make a detection estimated angle greater than the emission angle of the signal electrons by bringing the detection surface 10 close to the primary electron beam optical axis 3.

For example, it becomes possible to perform the detection according to the middle angle reflected electrons of the tip collision track 13 of the inner magnetic path 8 illustrated in FIG. 2(a), and it is possible to increase the detection amount of reflected electrons. Similar to FIG. 3, the detection surface is held by the supporting member 15 and moved by the driving mechanism 16 through the vacuum sealing member 17. At this time, by moving along a direction 18, the holding of the detection surface distance 11 and the shortening of the inner diameter are realized with one axis. Each of the divided detection surfaces is controlled and positioned independently from each other by the driving mechanism 16.

When the detector is configured with a scintillator, a light guide, and a light detection element, the light guide can be designed in a linear structure to improve the light utilization efficiency. In addition, since the light detection element can be placed in the atmospheric pressure space, it is also effective from the viewpoint of element mounting.

A control method of the detection surface 10 will be described with reference to FIG. 6. The detection surface 10 is movable by the supporting component 15. In a case of a shape in which the inner diameter of the divided detection surface 10 narrows as illustrated in FIG. 5, it is possible to change the height and the inner diameter by operating along the direction 18 with one axis. By calculating and controlling a control signal for changing the height of the sample stage to the movable amount of the detection surface, the accuracy of the detection surface distance 11 can be acquired. In addition, even in a case of 3 axes including x, y, and z directions instead of the direction 18, the detection surface can be moved by the same control signal by having coefficients a, b, and c that define the detection surface position.

FIG. 7 illustrates a configuration in which a through-hole is made below the outer magnetic path 7 and the detector is disposed. Specifically, the magnetic path is divided, and the lower magnetic path 19 is disposed on the lower surface of the outer magnetic path 7. FIG. 7 is a sectional view, and is a configuration in which the lower magnetic path 19 is held by the outer magnetic path 7 in a section of another orientation and there is a space for making the supporting member 15 pass through at a part thereof. The configuration is realized by attaching the lower magnetic path 19 after making the supporting member 15 pass through the outer magnetic path 7. The divided detection surface 10 includes the driving mechanism 16 outside the outermost diameter of the outer magnetic path 7 passing through the space inside the magnetic path. The driving mechanism 16 moves the detection surface 10 in the horizontal direction and in the height direction, and maintains the detection surface distance 11. By moving the driving portion far from the sample or the high voltage portion, it is possible to suppress the influence of generation of foreign matter or the like caused by sliding.

Figure 16A:
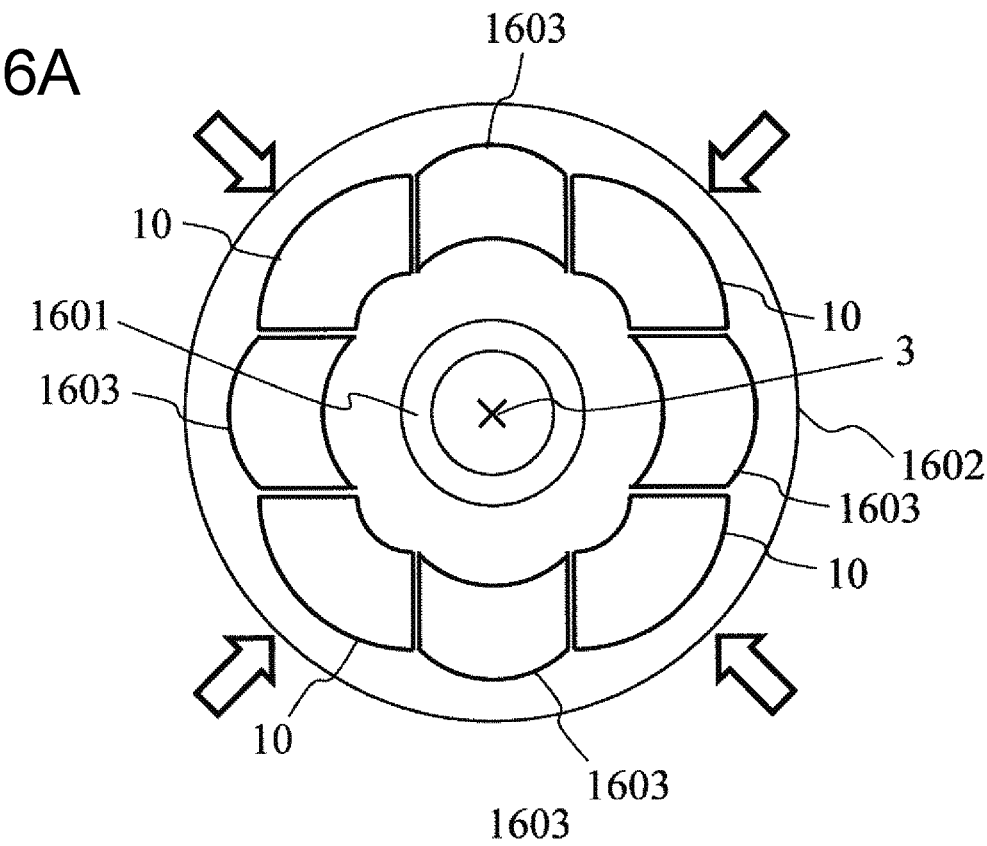
FIGS. 16A and 16B are views illustrating a state where a detection surface for detecting electrons emitted from a sample is accommodated in a lens gap of an objective lens, and a state where the detection surface is positioned close to the sample outside the lens gap.
Figure 16B:
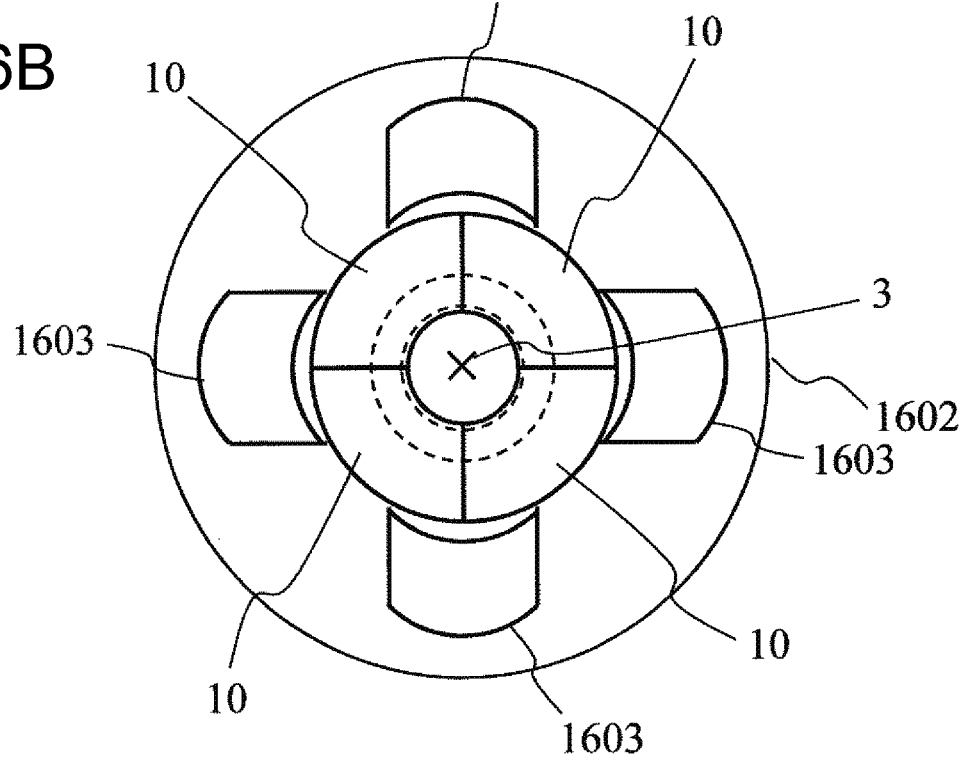

FIG. 16 is a view of the divided type detector illustrated in FIGS. 4 and 5 when viewed from the lower side (sample side). FIG. 16(a) illustrates a state where the detection surface 10 is accommodated in the lens gap of the objective lens, and FIG. 16(b) illustrates a state where four detection surfaces 10 are integrated with each other by moving the detection surface 10 in an arrow direction from the state of FIG. 16(a). A reference numeral 1601 denotes a sample side end portion of the inner magnetic path, and a reference numeral 1602 denotes an optical axis side end portion of the outer magnetic path. In a detector structure illustrated in FIG. 16, in addition to the four detection surfaces 10, a second detection surface 1603 disposed between the detection surfaces 10 is provided in a state where the detection surface 10 is accommodated in the lens gap.

According to such a configuration, axial symmetry around the beam optical axis can be enhanced when the four detection surfaces 10 are accommodated in the lens gap, and the electrons can be detected even on the second detection surface 1603, and thus, it becomes possible to improve the detection efficiency. In addition, in the configuration of FIG. 16, since the four detection surfaces 10 are configured to be annular in a state where the four detection surfaces 10 are lowered toward the sample, the outer shape of the four detection surfaces 10 and the second detection surface 1603 is not a perfect circle when being accommodated in the lens, but with priority given to the axial symmetry when being accommodated in the lens gap, when the four detection surfaces 10 and the second detection surface 1603 are accommodated in the lens gap, each of the detection surfaces may be formed such that the outer shape thereof becomes a perfect circle.

An angle discrimination detection method of the signal electrons by the detector movement will be described with reference to FIG. 8. By changing the detection surface distance 11 in a state where WDs 4 are the same, and by changing the detection estimated angle from the emission point of the signal electrons, for example, it becomes possible to select and detect the track 13 or the track 14 in FIG. 2(a), and an angle discrimination effect of the detected signal electrons can be obtained. In other words, by selecting the detection angle, the detection system can be optimized according to the sample or the evaluation item.

Example 2

FIG. 9 is a schematic view illustrating a basic configuration of the example. The detection surface 10 is configured to be inserted through the lower side of the outer magnetic path 7 in a case where the WD 4 is long using the driving mechanism 16 disposed in a vacuum. By integrating and moving the sample stage, the detector, and the driving mechanism in the height direction, the operation is performed while maintaining the detection surface distance 11 constant. The same method can be realized even when the lower part of the outer magnetic path 7 is inclined. The detection surface 10 may be a scintillator or a semiconductor detector.

In a case where the detection surface 10 is a scintillator, the supporting member 15 is configured with a light-guiding member, such as a light guide or an optical fiber, and a detector control portion is simultaneously mounted on the driving mechanism 16. In a case of a semiconductor detector, it is possible to pass through wiring to the supporting member 15, and similarly, it is possible to mount a detector control portion on the driving mechanism 16. By moving the driving mechanism 16 in the height direction, the detection surface distance 11 is maintained constant.

Figure 10A:
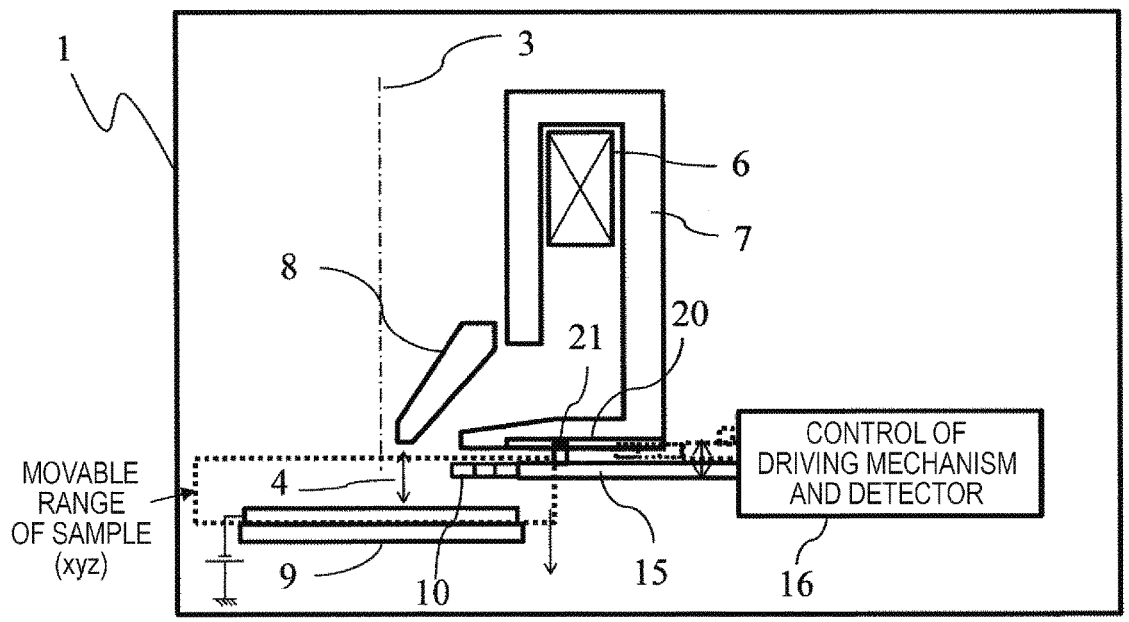
FIGS. 10A and 10B are schematic views of a configuration in which the detection surface is inserted along a groove along a lower surface of the magnetic path.

In a case of moving linearly, there is a concern that the components collide with each other due to a detector position shake during the movement. A specific insertion method will be described with reference to FIG. 10. FIG. 10(a) is a part of a sectional view of the electron microscope barrel. A groove 20 (guide) through which the supporting member 15 passes is provided on the lower surface of the outer magnetic path 7. The supporting member 15 has a projection 21, and the projection 21 moves along the groove 20. The position of the detection surface 10 is determined when the projection 21 comes into contact with the end portion of the groove 20.

In a case of shortening the WD 4, in order to retract the detector to the outside of a sample movable range, it is necessary to sufficiently ensure the driving mechanism and stroke thereof. In addition, a configuration is considered in which the detector is retracted by moving the detector in the Z direction and accommodating the detector in the groove 20 after the projection 21 is moved to the outside of the magnetic path. Further, by folding the supporting member 15, it is possible to dispose the detector out of the sample movable range without moving away the driving mechanism.

Figure 10B:
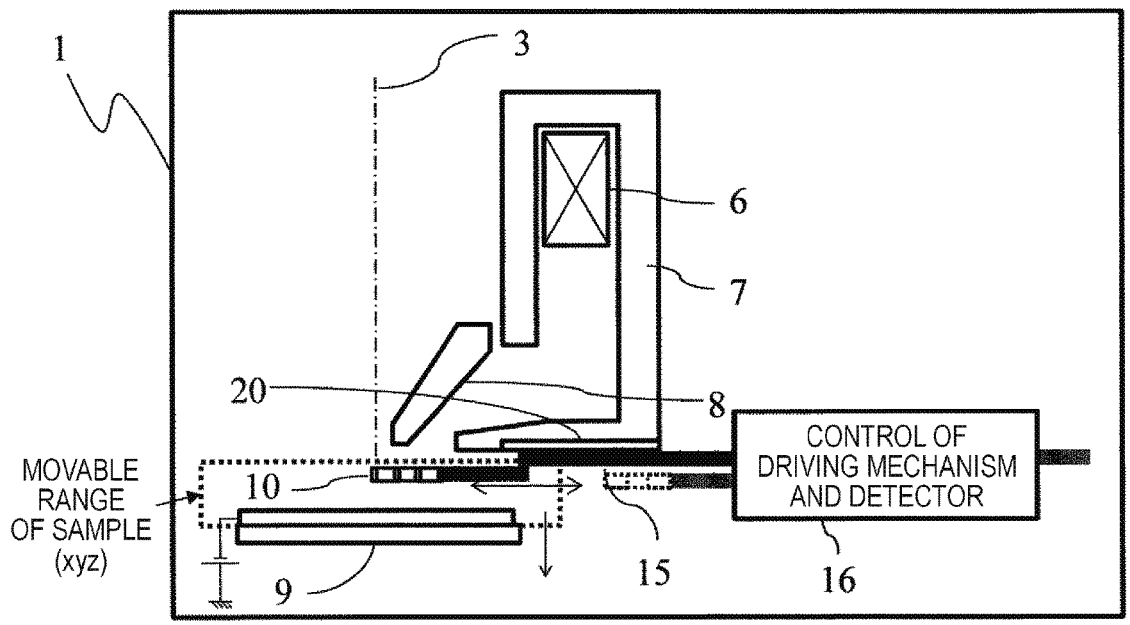

In addition, as another aspect in FIG. 10(b), a structure in which the supporting member 15 has a step is illustrated. In the supporting member having a step, a part close to the lower surface of the outer magnetic path 7 is disposed to move along the groove 20. After the sample stage 9 moves so as to lengthen the WD, the detection surface 10 is held by the supporting member 15 and moved by the driving mechanism. The position of the detection surface 10 is determined as the end portion of the groove 20 of the outer magnetic path 7 and the stepped part of the supporting member 15 come into contact with each other. By holding the supporting member 15 as close as possible to the detector position as illustrated in FIGS. 10(a) and 10(b), it is possible to suppress the shake of the detector and to stably move the detector.

Meanwhile, when the sliding portion exists in a vacuum, there is an influence of foreign matter. Therefore, it is necessary to move the detector in a state where the sample is not held by the sample stage 9, remove the foreign matter from around the sample stage 9 by using an electric field or the like, and then input the sample.

As a driving method, not only insertion along a straight line but also insertion by a circle motion centered around the outside of the outer magnetic path 7 as illustrated in FIG. 11 is possible. From the driving mechanism 16 to the detection surface 10, the sample stage 9 is under vacuum atmosphere.

When the motion is set to the circle motion, by centering on the outer diameter position of the electron microscope barrel, the structure can be accommodated inside a square of which an outer diameter is one side, and the space to be used can be made smaller than that in linear insertion. Even in a case of the insertion by the circle motion, as illustrated in FIG. 10, a configuration can be provided in which an arc-shaped groove centering on the driving mechanism is formed on the lower surface (opposing surface to the sample of the objective lens) of the objective lens and the supporting member 15 moves along the groove.

Further, FIG. 12 illustrates a schematic view in which two detectors are attached to the driving mechanism. The detection surface 10 and the supporting member 15 thereof, and the second detection surface 22 and the supporting member 23 thereof are connected to one driving mechanism 16. By attaching a plurality of detectors with different sensitivities and heights in accordance with the accelerating voltage and the WD, various detectors can be used in accordance with the application. For example, from the viewpoint of energy discrimination of the signal electrons, a metal film of which the thickness changes on the surface by the detection surface 10 and the second detection surface 22 is generated, only the electrons transmitted through the metal film are detected, and accordingly, it is possible to have a function of an energy filter.

It is also possible to divide the detection surface 10 and insert the divided detection surfaces from a plurality of directions. In this case, the position accuracy can be improved by alternately providing a projection portion and a recess portion on the detection surface and by incorporating the projection portion and the recess portion when being inserted between the objective lens magnetic path 7 and the sample. In addition, since the detectors can be configured to be axial symmetrical, variations in signal detection efficiency in an azimuth direction can be reduced.

Figure 17A:
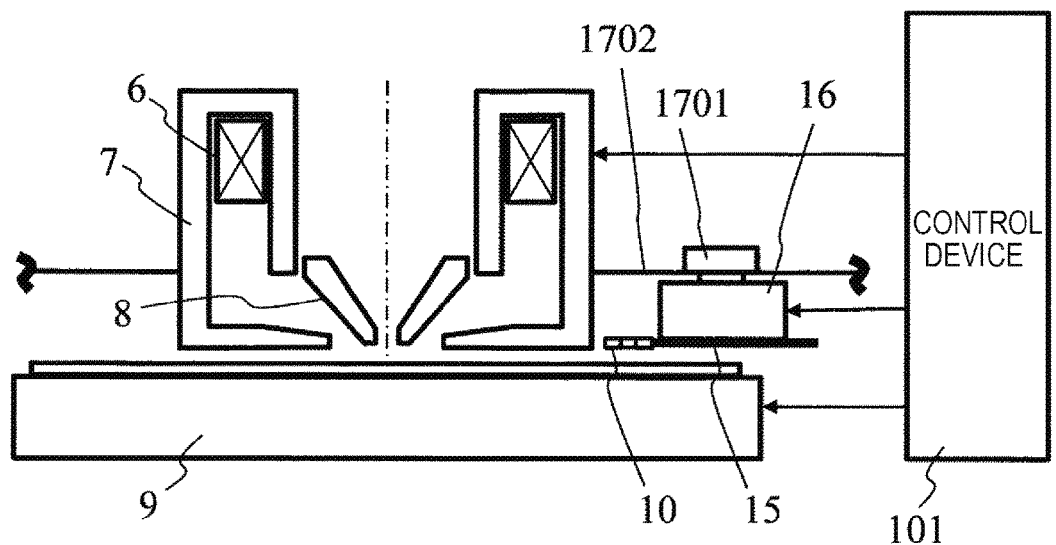
FIGS. 17A and 17B are views illustrating an example of a scanning electron microscope including a moving mechanism for moving a driving mechanism for moving the detector up and down.
Figure 17B:
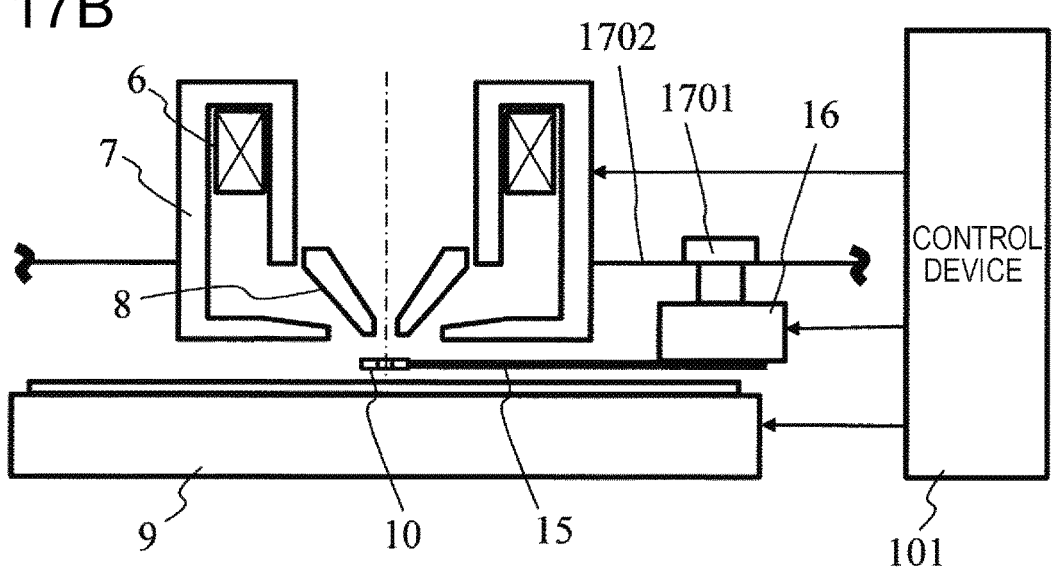

In addition, in a case of an device for measuring and inspecting a large sample, such as a semiconductor wafer, the movement range is wide. FIG. 17 illustrates an example of the scanning electron microscope including a moving mechanism that moves the driving mechanism for moving the detector up and down (the beam irradiation direction, z direction) such that the moving range of the sample and the driving mechanism for moving the detector do not interfere with each other when the WD is short. As illustrated in FIG. 17, the driving mechanism 16 for moving the detection surface 10 from the outside of the optical axis to the optical axis is supported by a driving mechanism 1701 for moving the driving mechanism 16 in the z direction. The driving mechanism 1701 is supported by a top plate 1702 of a vacuum sample room, and when setting the short WD, the driving mechanism 1701 raises up the detection surface 10, the supporting member 15, and the driving mechanism 16 until reaching a height at which the lowermost surfaces of the detection surface 10, the supporting member 15, and the driving mechanism 16 do not interfere with the movement track in the x-y direction of the sample (FIG. 17(a)). Further, when setting the long WD, the detection surface 10, the supporting member 15, and the driving mechanism 16 are lowered (FIG. 17(b)).

According to the configuration illustrated in FIG. 17, since the detection mechanism including the driving mechanism is installed to be positioned in the vacuum sample chamber, that is, in the space between the lower surface of the objective lens and the top plate of the vacuum sample chamber, it becomes possible to realize detector installation that can achieve high efficiency when setting the long WD while ensuring a wide movement track of the sample when setting the short WD.

Further, as illustrated in FIG. 18, by providing a guide hole 1801 for positioning the detection surface 10 in the end portion or the like of the inner magnetic path 8, and by fitting a supporting member 1802 into the guide hole 1801, the detection surface 10 may be configured to be positioned at an appropriate position.

Figure 23A:
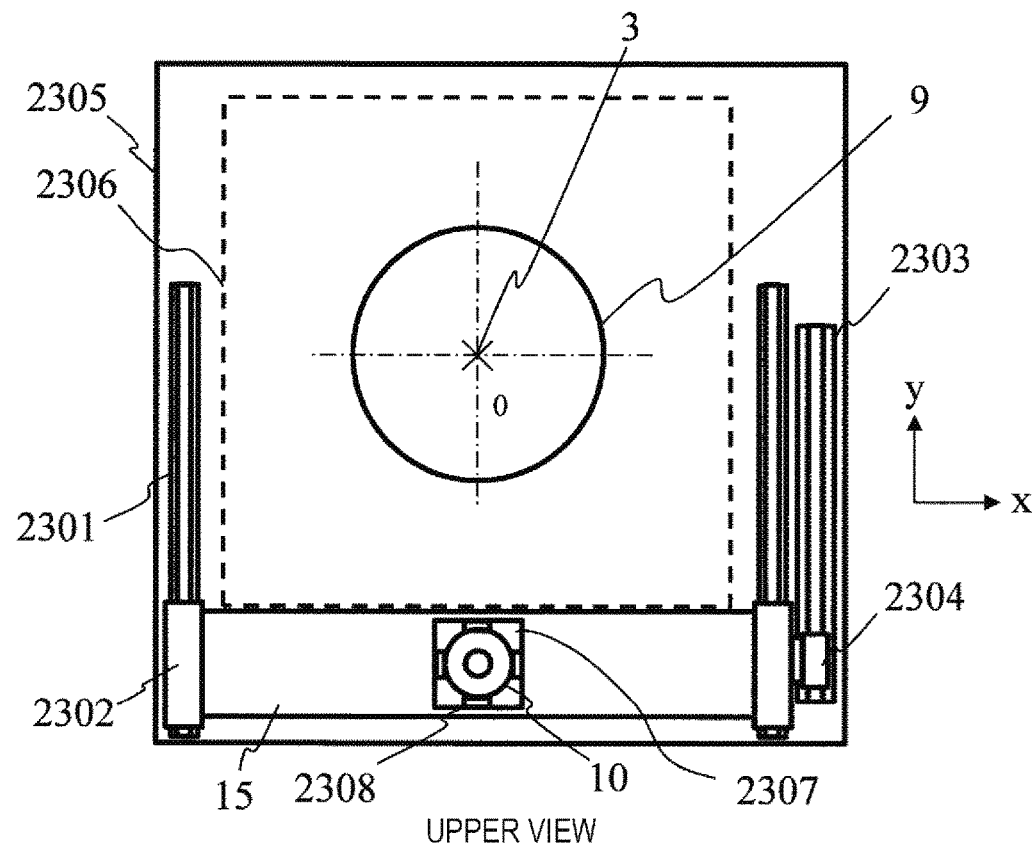
FIGS. 23A and 23B are views illustrating an example in which a linear motor is adopted as a driving mechanism for moving the detection surface.
Figure 23B:
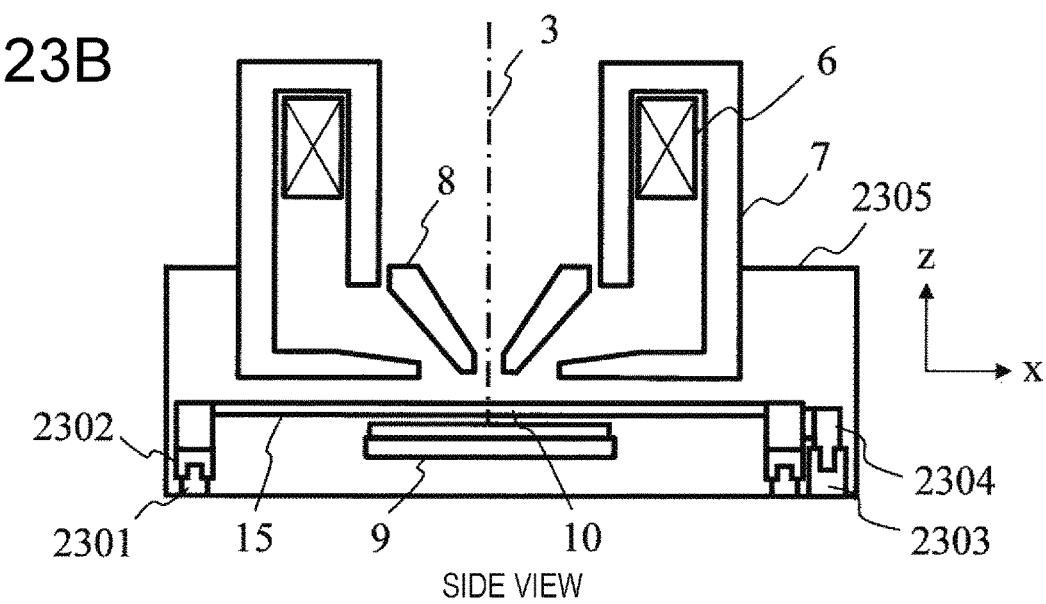

FIG. 23 is a view illustrating another aspect of the present embodiment, and is a view illustrating an example in which a linear motor having a coil 2304 (mover) and a permanent magnet 2303 (stator) is adopted as a driving mechanism for moving the detection surface 10. FIG. 23(a) is a view (upper view) of the charged particle beam device viewed from the optical axis direction, and FIG. 23(b) is a view (side view) from the direction (y direction) orthogonal to the optical axis of the charged particle beam device. The detection surface 10 is supported by the supporting member 15, and the supporting member 15 is supported by a slide unit 2302. The slide unit 2302 is guided to the rail 2301 and moves in the y direction by a driving force supplied from the linear motor.

Further, the sample stage 9 moves within a movable range 2306 by the driving force supplied from the driving mechanism (not illustrated) in the x-y direction.

The control device for controlling the charged particle beam device illustrated in FIG. 23 controls the linear motor such that the detection surface retracts from the movable range 2306 when setting the short WD, and controls the linear motor such that the opening center of the detection surface 10 and the position of the primary electron beam optical axis 3 match each other when setting the long WD.

In addition, an opening 2307 is provided in the supporting member 15, and the detection surface 10 is provided in the opening 2307. The detection surface 10 is supported by piezo actuators 2308 provided in pairs in the x-y directions. The piezo actuator 2308 is provided to move the detection surface 10 in the x-y direction, and is used for fine adjustment of the position of the detection surface 10. For example, in a case of moving the detection surface 10 in the x direction, a voltage of a reverse phase is applied to the pair of piezo actuators provided in the x direction, and the detection surface 10 is finely moved. In addition, in the example of FIG. 23, although the detection surface provided with the fine movement mechanism in the x-y direction has been described as an example, the fine movement mechanism in the z direction may be provided.

By performing control such that the detection surface is moved so as to avoid the movable range of the sample or the sample stage when setting the short WD and the detection surface is moved to be positioned immediately below the objective lens when setting the long WD, it becomes possible to achieve both high resolution by the setting of the short WD and improvement of detection efficiency when setting the long WD. In addition, since the detection surface is supported by two supporting members, it becomes possible to position the detection surface at a predetermined position with high accuracy. Meanwhile, since it becomes unnecessary to concern about synchronization of two slide units as the number of rails 2301 decreases, a configuration in which the number of rails 2301 is one may be considered. It is possible to manage dust generation by moving the rail 2301 portion away from the sample, and to reduce the possibility of breakage due to the movement. In addition, in FIG. 23, although an example of installing the rail for guiding the slide unit or the stator of the linear motor on a sample chamber floor surface has been described, the present disclosure is not limited thereto, and the members may be installed on the side wall or the top plate.

Example 3

In the example, a position adjustment method with high accuracy of a driving detector will be described. The position adjustment method using a voltage applied to the sample stage 9 will be described with reference to FIG. 13. In a case where a negative voltage is applied to the sample stage 9 and the detection surface 10 exists immediately above the sample, a potential distribution 24 is formed by a potential difference. At this time, when the axis (the opening center of the detection surface 10) of the detection surface 10 is shifted from the primary electron beam optical axis 3, the primary electron beam is bent by the electric field. As a result, the position to reach the sample changes by changing the voltage applied to the sample stage 9. The position adjustment becomes possible by adjusting the position of the detection surface 10 so as to make a positional shift of the primary electron beam zero.

In addition, in the example described below, in order to visualize the position of the detection surface 10 (opening of the detection surface 10), a detector (not illustrated) different from the detection surface 10 is provided between the detection surface 10 and the electron source 2, and the opening of the detection surface 10 is imaged based on the output of the detector.

FIG. 21 is a flowchart illustrating a positioning process of the detection surface. In addition, the detection surface 10 illustrated in FIG. 13 is supported by the moving mechanism (not illustrated), and can move, for example, in the x, y, and z directions. First, the detection surface 10 is moved to a position $P_s$ such that the primary electron beam optical axis 3 and the opening center of the detection surface 10 match each other by the moving mechanism of the detection surface (step 2101). Next, a sample voltage is set to V1 (step 2102), the electron beam is scanned in a state (first state) where the detection surface position set in step 2101 is maintained, and a SEM image (first image) is generated (step 2103). Furthermore, in the first state, the sample voltage is set to V2 (step 2104), and a SEM image (second image) at that time is generated (step 2105).

At this time, when there is no shift between a pattern included in the SEM image acquired in the state of the sample voltage V1 and a pattern included in the SEM image obtained in the state of the sample voltage V2, the position of the detection surface is set to be an appropriate position, and thus, the positioning process of the detection surface ends. At this time, in a case where the shift is zero or the shift is equal to or less than a predetermined value, it is determined that there is no shift.

In a case where there is a shift, the position of the detection surface 10 is changed by Δd (step 2107), and in a state where the position of the detection surface is positioned at $P_{\Delta d}$, SEM images (third and fourth images) are obtained by the sample voltages V1 and V2 again, and the shift evaluation is performed. In addition, in a case where the shift amount is not zero at the time when the third image and the fourth image are obtained, by using a shift $\Delta d_{12}$ between the first image and the second image and a shift $\Delta d_{34}$ between the third image and the fourth image, a movement amount $\Delta d_0$ to the detection surface position where the opening center of the detection surface matches the optical axis is calculated (step 2108). Then move detection surface by movement amount $d_0$ (step 2109).

Here, a method of calculating the movement amount $\Delta d_0$ using the four images will be described. Regarding the shift amount, as illustrated in FIG. 22, from the shift amount ($\Delta d_{12}$, $\Delta d_{34}$) between the images when the sample voltage acquired at the position ($P_s$, $P_{\Delta d}$) of two or more detection surfaces is changed, a coefficient (gradient of a straight line 2201 in the example of FIG. 22) included in a function that considers the shift amount and the position of the detection surface as variables are acquired, for example, by using a simultaneous equation or the like, and by using the function including the coefficient, $\Delta d_0$ is calculated by acquiring a detection surface position $P_M$ at which the shift amount becomes zero. In addition, in the example, in order to make the description simple, an example in which only the shift in the x direction is corrected has been described, but the present disclosure is not limited thereto, and the position adjustment of the detection surface may be performed based on the evaluation of the shift in a two-dimensional direction of the detection surface including the moving mechanism in two directions, such as the x and y directions.

Next, a position adjustment method in a case where a mechanism for applying the voltage to the detection surface 10 is provided will be described with reference to FIG. 14. When the voltage is applied, an electrostatic lens 25 is formed to give influence to the primary electron beam. In a case where the axis of the electrostatic lens 25 does not match the primary electron beam optical axis 3, the position of the primary electron beam converged on the sample changes depending on the voltage value.

The position adjustment becomes possible by moving the detection surface 10 so as to suppress the positional shift at this time. Further, after the position adjustment, by evaluating a convergence value in the electrostatic lens 25 by a specified objective lens excitation amount and a specified voltage, it is possible to perform the position adjustment in the height direction. In a case where the detection surface 10 is divided, a voltage is applied to each detection surface 10. For example, in a case of dividing the detection surface into four, the electrostatic lens 25 has a two-dimensional distribution in the x and y directions. By making each control voltage constant and observing the positional shift and the direction of the shift while controlling the intensity of the electrostatic lens by the voltage, it is possible to control the divided detection surfaces 10 independently. In addition, by controlling the voltage well, it is also possible to apply this method to the control of the convergence or the like of the primary electron beam.

Further, the positioning of the detection surface may be performed according to the flowchart illustrated in FIG. 21.

Figure 15A:
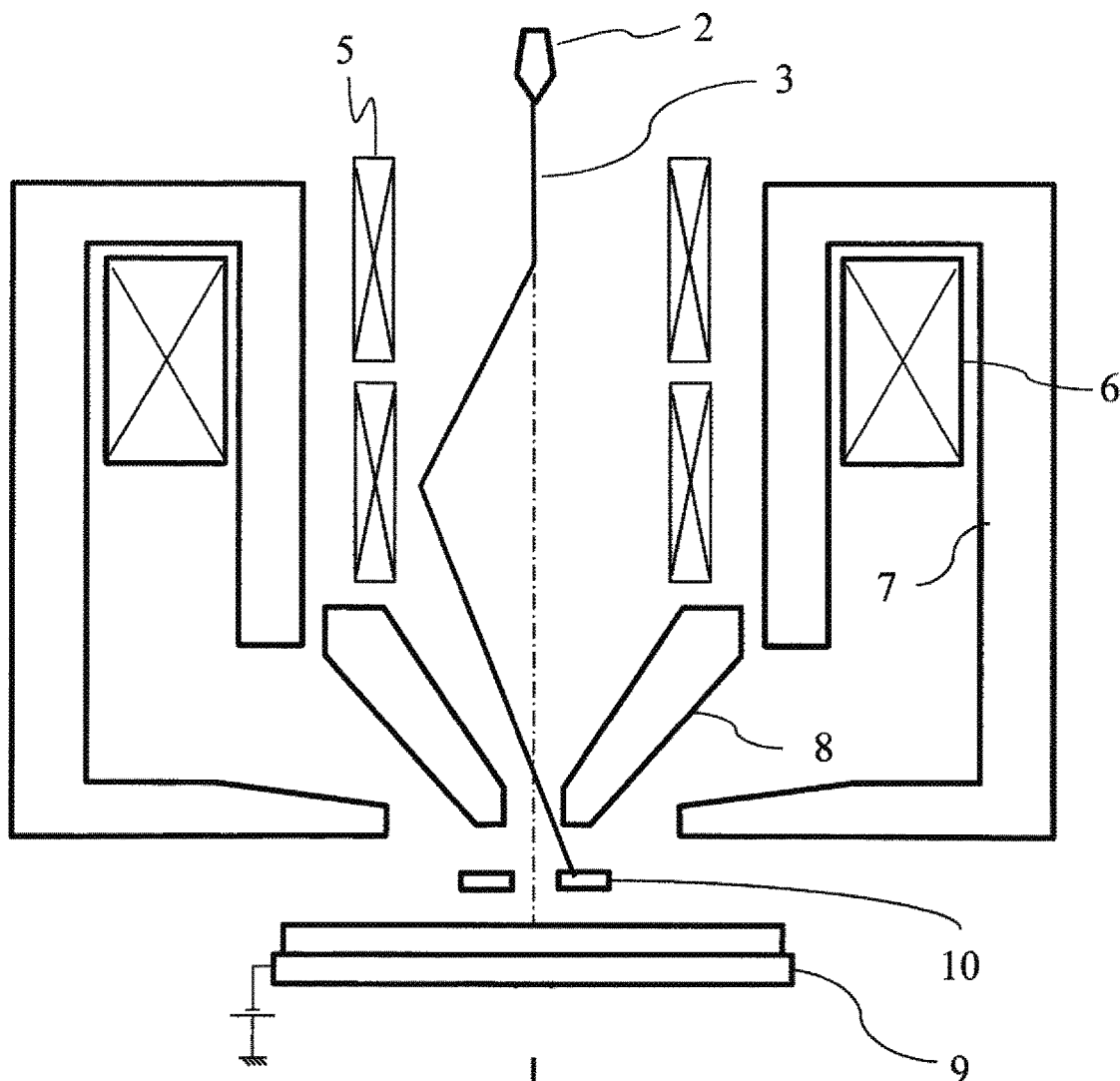
FIGS. 15A and 15B are schematic views illustrating a position adjustment method using an electron microscope image.
Figure 15B:
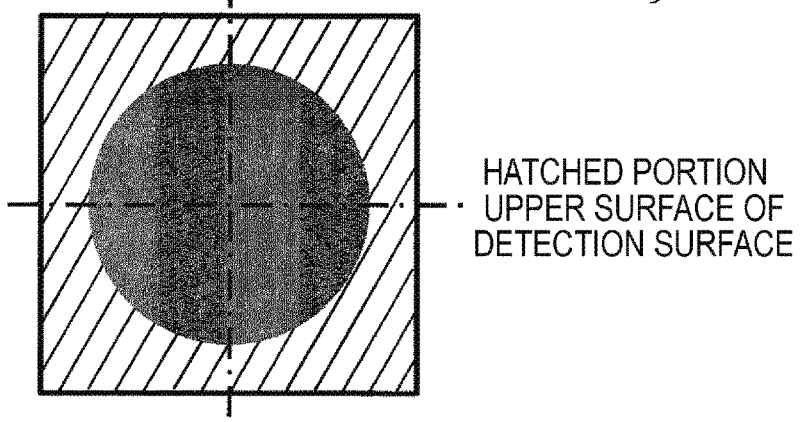

A position adjustment method using an electronic microscopic image will be described with reference to FIG. 15(a). When the primary electron beam is scanned on the detection surface by the deflector 5 to obtain a two-dimensional image, as illustrated in FIG. 15(b), an image having a circular shape at the center and an outer peripheral portion which is an upper portion of the detection surface is acquired. The position adjustment of the detection surface becomes possible by moving the position such that the center of the circle is aligned with the image center. In addition, it is also possible to examine that the detection surface 10 is inclined with respect to the primary electron beam optical axis 3 by examining the luminance distribution of the detection surface 10 or the roundness of the center circle, and it is possible to adjust surface inclination in the horizontal direction. In addition, since it is possible to know the position in the height direction by evaluating the excitation amount of the objective lens for converging the primary electron beam on the detection surface 10, the position adjustment of the detection surface can be performed by aligning the height to achieve the specified excitation amount.

For example, the excitation condition (lens condition) of the objective lens for focusing at the position of the upper surface of the detection surface when an appropriate detection surface height is achieved is stored in the storage medium 103 in advance, and the objective lens is controlled such that the stored lens conditions are satisfied when adjusting the height of the detection surface. In addition, in a state where the lens condition is maintained, the focus evaluation value of the image is evaluated while changing the height of the detection surface, and the detection surface position is adjusted to become a detection surface position at which the focus evaluation value becomes the highest or equal to or greater than a predetermined value.

REFERENCE SIGNS LIST

1: electron microscope barrel
2: electron source
3: primary electron beam optical axis
4: distance (WD) between magnetic path and sample surface
5: deflector
6: objective lens coil
7: outer magnetic path
8: inner magnetic path
9: sample stage
10: detection surface
11: distance between detection surface and sample surface
12: track of high angle reflected electrons passing inner magnetic path
13: track of middle angle reflected electron colliding with inner magnetic path 8
14: track of low angle reflected electrons returning to sample
15: supporting member
16: driving mechanism
17: vacuum sealing member
18: movable direction
19: lower magnetic path
20: groove of magnetic path
21: projection in supporting member
22: second detection surface
23: second supporting member
24: potential distribution
25: electrostatic lens

The invention claimed is:

1. A charged particle beam device comprising:
an objective lens for converging a charged particle beam emitted from a charged particle source;
a sample stage having a first driving mechanism for moving a sample to be irradiated with the charged particle beam between a first position and a second position more separated from the objective lens than the first position;
a detection surface for detecting charged particles emitted from the sample; and
a second driving mechanism for moving the detection surface between within a movable range of the sample between the first position and the second position and out of the movable range of the sample.

2. The charged particle beam device according to claim 1, further comprising:

a supporting member for connecting the detection surface and the second driving mechanism to each other, wherein the objective lens has a first magnetic pole and a second magnetic pole more separated from a charged particle beam optical axis than the first magnetic pole, and the second driving mechanism moves on the detection surface between a lens gap formed between the first magnetic pole and the second magnetic pole and the movable range of the sample.

3. The charged particle beam device according to claim 2, further comprising:

a supporting member for connecting the second driving mechanism and the detection surface to each other, wherein the supporting member supports the detection surface through the lens gap.

4. The charged particle beam device according to claim 2, wherein the second driving mechanism is disposed in an atmospheric pressure space enclosed by a magnetic path.

5. The charged particle beam device according to claim 2, wherein the detection surface includes a plurality of divided detection surfaces.

6. The charged particle beam device according to claim 5, wherein the second driving mechanism moves the divided detection surfaces to approach each other when the divided detection surfaces are positioned within the movable range of the sample compared to a case where the divided detection surfaces are positioned out of the movable range of the sample.

7. The charged particle beam device according to claim 6, wherein the divided detection surfaces are annular detection surfaces when the detection surfaces are positioned within the movable range of the sample.

8. The charged particle beam device according to claim 2, wherein the detection surface is a semiconductor detector.

9. The charged particle beam device according to claim 2, further comprising:

a supporting member for connecting the second driving mechanism and the detection surface to each other, wherein the detection surface is a scintillator and the supporting member is a light guide.

10. The charged particle beam device according to claim 1, further comprising:

a control device for controlling the first driving mechanism and the second driving mechanism, wherein the control device controls the first driving mechanism and the second driving mechanism so as to maintain a distance between the sample and the detection surface.

11. The charged particle beam device according to claim 1, wherein the detection surface is configured with a magnetic body.

12. The charged particle beam device according to claim 1, wherein the second driving mechanism moves the detection surface in a direction orthogonal to a beam optical axis of the charged particle beam.

13. The charged particle beam device according to claim 12, wherein a guide for guiding the detection surface moved by the second driving mechanism is provided on a surface on the sample side of the objective lens.

14. The charged particle beam device according to claim 12, wherein the detection surface has a plurality of divided detection surfaces, and the second driving mechanism moves the plurality of divided detection surfaces toward the optical axis of the charged particle beam.

15. The charged particle beam device according to claim 1, wherein the second driving mechanism is a rotating mechanism, and the detection surface is moved between within the movable range of the sample and out of the movable range of the sample by rotation of the rotating mechanism.

16. The charged particle beam device according to claim 15, wherein an arc-shaped groove is formed on a surface on the sample side of the objective lens, and the detection surface is guided by the groove.

17. The charged particle beam device according to claim 15, wherein the second driving mechanism is configured to move a plurality of supporting members for supporting the detection surface, and the plurality of the detection surfaces are switched by a rotational motion.

18. A charged particle beam device comprising:

an objective lens for converging a charged particle beam emitted from a charged particle source;

a sample stage for supporting a sample;

a detection surface for detecting electrons emitted from the sample;

a voltage source for applying a voltage to at least one of the sample stage and the detection surface;

a driving mechanism for adjusting a position of the detection surface; and a control device for controlling the driving mechanism, wherein the control device controls the driving mechanism so as to decrease a shift on an image on the detection surface when the voltage applied to at least one of the sample stage and the detection surface is changed.

* * * * *